(12) United States Patent
Na et al.

(10) Patent No.: US 10,896,946 B2
(45) Date of Patent: Jan. 19, 2021

(54) ORGANIC LIGHT EMITTING DIODE DISPLAY DEVICE

(71) Applicant: Samsung Display Co., Ltd., Yongin-Si (KR)

(72) Inventors: Jisu Na, Yongin-si (KR); Kwang-Min Kim, Seoul (KR); Ki Wook Kim, Hwaseong-si (KR); Hyun Joon Kim, Hwaseong-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/398,372

(22) Filed: Apr. 30, 2019

(65) Prior Publication Data

US 2019/0348489 A1    Nov. 14, 2019

(30) Foreign Application Priority Data

May 14, 2018    (KR) .................. 10-2018-0055139

(51) Int. Cl.
  *H01L 51/56* (2006.01)
  *H01L 27/32* (2006.01)
  *H01L 51/52* (2006.01)

(52) U.S. Cl.
  CPC ...... *H01L 27/3276* (2013.01); *H01L 27/3258* (2013.01); *H01L 27/3262* (2013.01); *H01L 51/5253* (2013.01); *H01L 51/56* (2013.01); *H01L 2227/323* (2013.01); *H01L 2251/5338* (2013.01)

(58) Field of Classification Search
  CPC ............ H01L 27/3276; H01L 27/3258; H01L 27/3262; H01L 51/5253; H01L 51/56; H01L 2227/323; H01L 2251/5338
  See application file for complete search history.

(56) References Cited

U.S. PATENT DOCUMENTS

| | | | | |
|---|---|---|---|---|
| 9,287,329 | B1* | 3/2016 | Lee | H01L 51/0097 |
| 2007/0002243 | A1* | 1/2007 | Kim | G02F 1/1345 |
| | | | | 349/139 |
| 2010/0283955 | A1* | 11/2010 | Kim | G02F 1/1345 |
| | | | | 349/149 |
| 2018/0212191 | A1* | 7/2018 | Jin | H01L 51/56 |

FOREIGN PATENT DOCUMENTS

KR    10-2017-0130016 A    11/2017

* cited by examiner

*Primary Examiner* — Fernando L Toledo
*Assistant Examiner* — Valerie N Newton
(74) *Attorney, Agent, or Firm* — Innovation Counsel LLP

(57) ABSTRACT

An organic light emitting diode display device includes a substrate, light emitting structures, fan-out wirings, and a wiring structure. The substrate has a display region including a light emitting region and a peripheral region surrounding the light emitting region and a pad region located in one side of the display region. The light emitting structures are disposed in the light emitting region on the substrate. The fan-out wirings are disposed in the peripheral region on the substrate, and the fan-out wirings include a straight-line portion and an oblique line portion. The wiring structure is disposed on the fan-out wirings, and includes a conductive layer and conductive patterns spaced apart from each other and disposed on the conductive layer.

20 Claims, 21 Drawing Sheets

FIG. 2
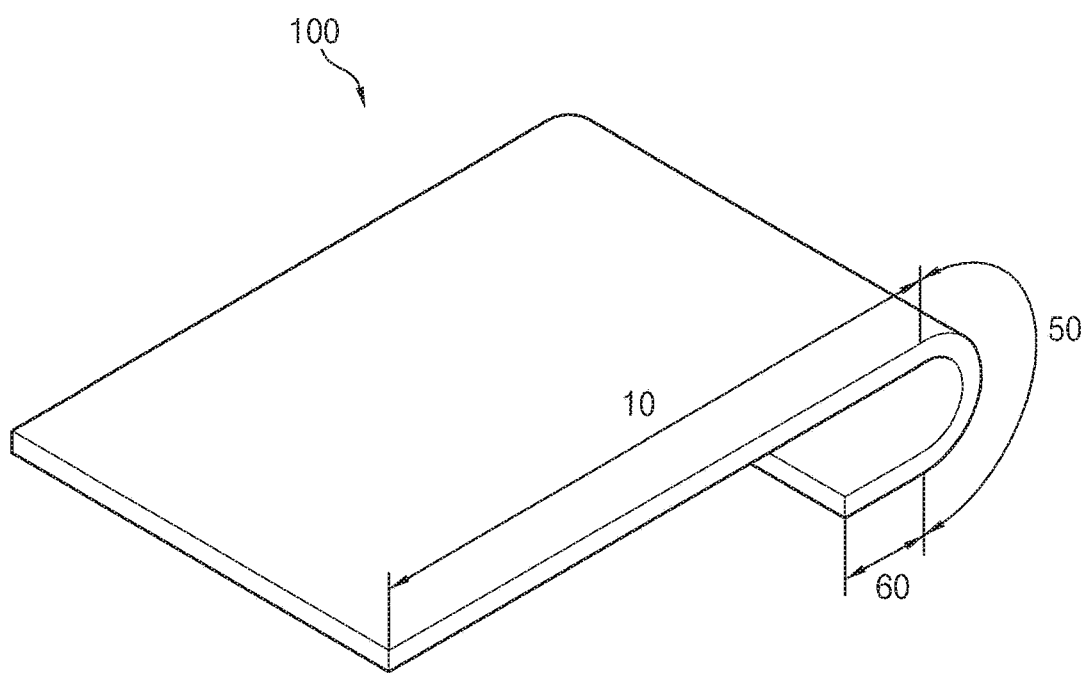
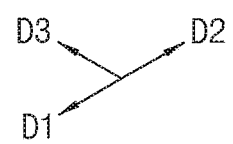

ORGANIC LIGHT EMITTING DIODE DISPLAY DEVICE

CROSS-REFERENCE TO RELATED APPLICATION(S)

This application claims priority under 35 USC § 119 to Korean Patent Applications No. 10-2018-0055139, filed on May 14, 2018 in the Korean Intellectual Property Office (KIPO), the contents of which are incorporated herein in its entirety by reference.

BACKGROUND

1. Field

Example embodiments relate generally to an organic light emitting diode display device. More particularly, embodiments of the present inventive concept relate to an organic light emitting diode display device including a plurality of fan-out wirings.

2. Description of the Related Art

A flat panel display ("FPD") device is widely used as a display device of an electronic device because the FPD device is lightweight and thin compared to a cathode-ray tube ("CRT") display device. Typical examples of the FPD device are a liquid crystal display ("LCD") device and an organic light emitting diode ("OLED") display device.

The OLED display device may have a display region including a light emitting region and a peripheral region surrounding the light emitting region, and a pad region located in one side of the display region. A plurality of pads may be disposed in the pad region, and the OLED display device may receive a plurality of signals generated from an external device through the pads. The signals may be applied to a plurality of light emitting structures disposed in the light emitting region through a plurality of fan-out wirings that are disposed in the peripheral region located adjacent to the pad region. However, light incident from an outside may be irregularly reflected from the wirings, and a visibility of the OLED display device may be reduced because the irregular (or diffused) reflection light is viewed by a user of the OLED display device.

SUMMARY

Some example embodiments provide an organic light emitting diode ("OLED") display device.

According to some example embodiments, an OLED display device includes a substrate, a plurality of light emitting structures, a plurality of fan-out wirings, and a wiring structure. The substrate has a display region including a light emitting region and a peripheral region surrounding the light emitting region and a pad region located in one side of the display region. The light emitting structures are disposed in the light emitting region on the substrate. The fan-out wirings are disposed in the peripheral region on the substrate, and the fan-out wirings include a straight-line portion and an oblique line portion. The wiring structure is disposed on the fan-out wirings, and includes a conductive layer and a plurality of conductive patterns spaced apart from each other and disposed on the conductive layer.

In example embodiments, the conductive patterns may be located to overlap the fan-out wirings.

In example embodiments, the conductive layer may be in direct contact with the conductive pattern.

In example embodiments, the fan-out wirings and the wiring structure may be disposed at the peripheral region that is located between the light emitting region and the pad region in the peripheral region.

In example embodiments, each of the straight-line portion of the fan-out wirings may extend in a first direction from the pad region into the display region, and each of the oblique line portion of the fan-out wirings may extend in a direction that is different from the first direction.

In example embodiments, the straight-line portion and the oblique line portion may be integrally formed.

In example embodiments, the oblique line portion may have a first distal end connected to the straight-line portion and a second distal end aligned in one side of the light emitting region.

In example embodiments, the fan-out wirings may include lower fan-out wirings disposed on the substrate and upper fan-out wirings disposed on the lower fan-out wirings.

In example embodiments, the lower fan-out wirings and the upper fan-out wirings may be alternately disposed not to overlap one another.

In example embodiments, the conductive pattern may overlap the upper fan-out wiring.

In example embodiments, the fan-out wirings may include first through (N)th fan-out wirings, where N is an integer greater than 1. (K)th and (K+1)th fan-out wirings among the first through (N)th fan-out wirings may be located on different layers, and might not overlap each other, where K is an integer between 1 and N.

In example embodiments, the conductive patterns may include first through (M)th conductive patterns, where M is an integer greater than 1. A (J)th conductive pattern among the first through (M)th conductive patterns may be disposed on the (K)th fan-out wirings, and the (J)th conductive pattern might not overlap the (K+1)th fan-out wiring, where J is an integer between 1 and M.

In example embodiments, the OLED display device may further include an insulating interlayer disposed along a profile of the fan-out wiring in the peripheral region on the substrate. The conductive layer may be disposed along a profile of the insulating interlayer on the insulating interlayer.

In example embodiments, the conductive pattern may be disposed on a portion under which the fan-out wiring is disposed.

In example embodiments, the substrate may further include a bending region located between the display region and the pad region.

In example embodiments, the OLED display device may further include a plurality of pad electrodes and connection electrodes. The pad electrodes may be disposed in the pad region, and may be connected to an external device. The connection electrodes may be disposed in the bending region, and may electrically connect the fan-out wirings and the pad electrodes.

In example embodiments, the OLED display device may further include a plurality of semiconductor elements disposed between the substrate and the light emitting structures, a planarization layer disposed on the semiconductor elements, and a wiring pattern and a connection pattern disposed on the planarization layer.

In example embodiments, each of the semiconductor elements may include an active layer disposed on the substrate, a gate electrode disposed on the active layer, and source and drain electrodes disposed on the gate electrode.

The gate electrode and the fan-out wiring may be located on a same layer, and the source and drain electrodes and the conductive layer may be located on a same layer. The wiring and connection patterns and the conductive pattern may be located on a same layer.

In example embodiments, the planarization layer may be interposed between the wiring and connection patterns and the semiconductor element in the light emitting region, and might not be interposed between the conductive patterns and the conductive layer in the peripheral region.

In example embodiments, the OLED display device may further include a thin film encapsulation structure disposed on the light emitting structures. Each of the light emitting structures may include a lower electrode, a light emitting layer disposed on the lower electrode, and an upper electrode disposed on the light emitting layer. The thin film encapsulation structure may include a first thin film encapsulation layer, a second thin film encapsulation layer, and a third thin film encapsulation layer. The first thin film encapsulation layer may be disposed on the upper electrode, and may include inorganic materials having flexibility. The second thin film encapsulation layer may be disposed on the first thin film encapsulation layer, and may includes organic materials having the flexibility. The third thin film encapsulation layer may be disposed on the second thin film encapsulation layer, and may include the inorganic materials having the flexibility.

As the OLED display device according to example embodiments includes the wiring structure including the conductive layer and the conductive patterns that are spaced apart from each other on the conductive layer, the OLED display device may prevent a diffused reflection phenomenon because a step of a V shape is not formed in the conductive patterns. That is, although an external light is reflected from the conductive patterns and the conductive layer, the external light may be removed by the polarizing layer disposed on the wiring structure. Accordingly, visibility of the OLED display device may be relatively improved.

BRIEF DESCRIPTION OF THE DRAWINGS

Example embodiments can be understood in more detail from the following description taken in conjunction with the accompanying drawings, in which:

FIG. 2 is a perspective view for describing a bent shape of the OLED display device of FIG. 1;

DETAILED DESCRIPTION OF THE EMBODIMENTS

Hereinafter, embodiments of the present inventive concept will be explained in detail with reference to the accompanying drawings.

Figure 1A:
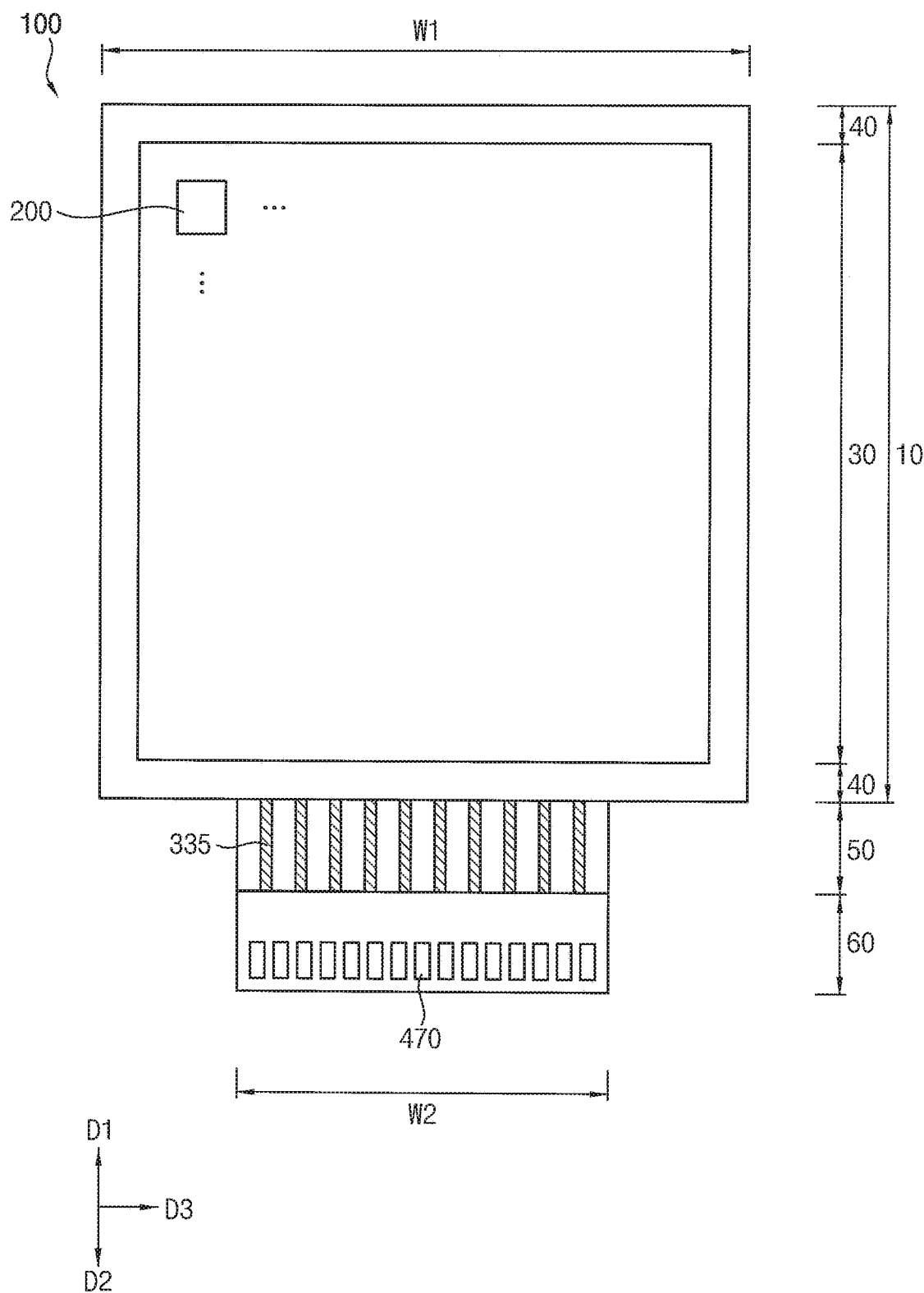
FIG. 1A is a plan view illustrating an organic light emitting diode ("OLED") display device in accordance with example embodiments.
Figure 1B:
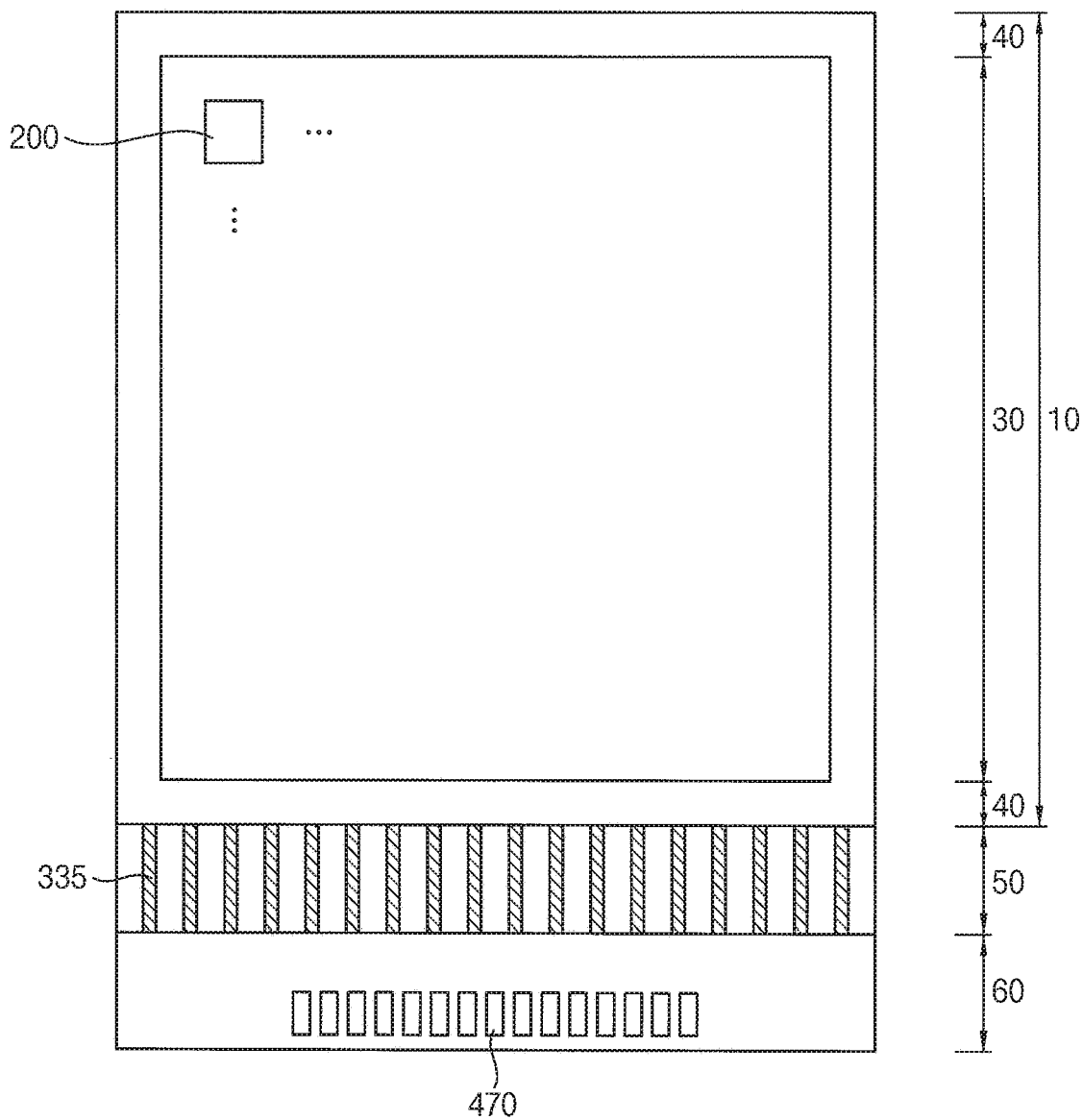
FIG. 1B is a plan view illustrating an example of the OLED display device.

FIG. 1A is a plan view illustrating an organic light emitting diode ("OLED") display device in accordance with example embodiments, and FIG. 1B is a plan view illustrating an example of the OLED display device. FIG. 2 is a perspective view for describing a bent shape of the OLED display device of FIG. 1, and FIG. 3 is a block diagram for describing an external device electrically connected to the OLED display device of FIG. 1.

Figure 3:
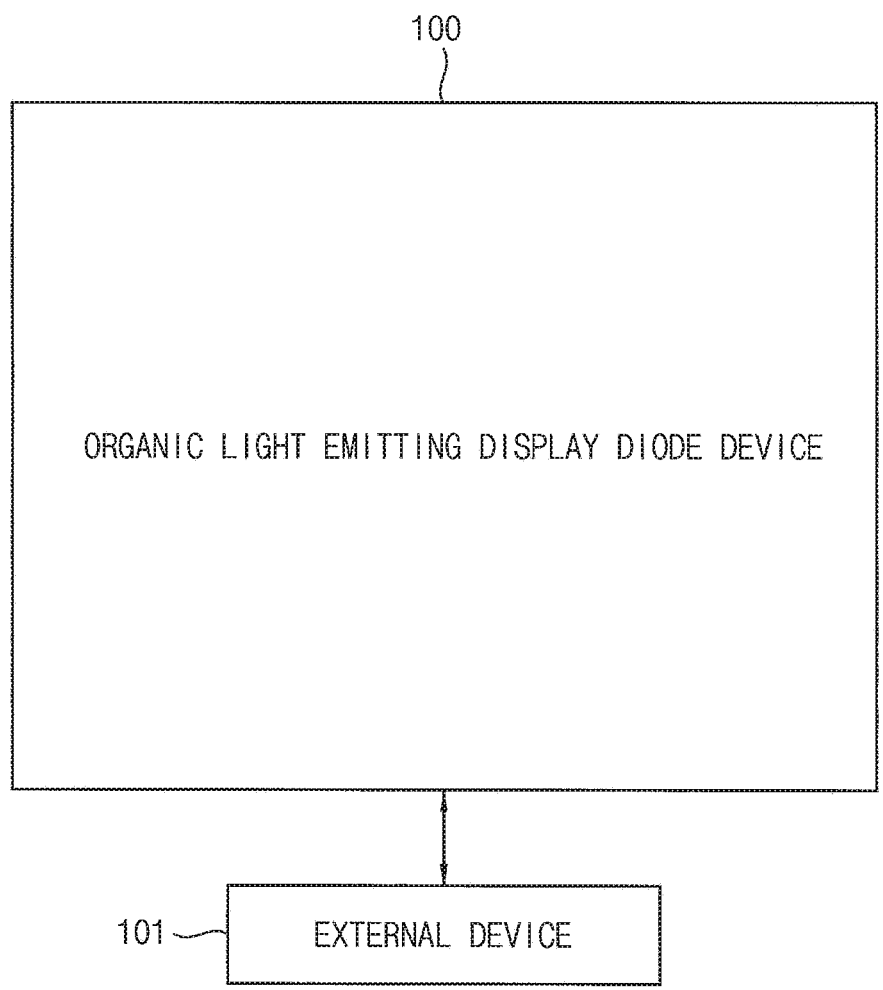
FIG. 3 is a block diagram for describing an external device electrically connected to the OLED display device of FIG. 1.

Referring to FIGS. 1A, 2, and 3, an OLED display device 100 may include a display region 10, a bending region 50, and a pad region 60. A plurality of light emitting structures 200 may be disposed in the display region 10, and the pad region 60 may be spaced apart from the display region 10. In other words, the pad region 60 may be located in one side of the display region 10. Pad electrodes 470 that are electrically connected to an external device 101 may be disposed in the pad region 60. In addition, the bending region 50 may be located between the display region 10 and the pad region 60, and connection electrodes 335 may be disposed in the bending region 50. In example embodiments, a width of the pad region 60 may be less than a width of the display region 10. For example, in a plan view of the OLED display device 100, the display region 10 may have a first width W1 extending in a direction (e.g., a third direction D3) that is parallel to an upper surface of the OLED display device 100, and the pad region 60 may have a second width W2 extending in the third direction D3 and less than the first width W1. In some example embodiments, as illustrated in FIG. 1B, a width of the display region 10 may be identical to a width of the pad region 60. Alternatively, the OLED display device 100 might not include the bending region 50. For example, the display region 10 may be located adjacent to the pad region 60.

The display region 10 may include a light emitting region 30 and a peripheral region 40 surrounding the light emitting region 30. The light emitting structures 200 capable of emitting light may be disposed in the light emitting region 30, and a plurality of wirings may be disposed in the peripheral region 40. In example embodiments, fan-out wirings and wiring structure may be disposed in the peripheral region 40 (e.g., the peripheral region 40 of FIG. 7) located between the light emitting region 30 and the bending region 50 (or the pad region 60). The wirings, the fan-out wirings, and the wiring structure may electrically connect the pad and connection electrodes 470 and 335 and the light emitting structures 200. For example, the wirings, the fan-out wirings, and the wiring structure may include data signal wirings, gate signal wirings, light emission signal wirings, initialization signal wirings, power supply wirings, etc. In addition, a scan driver, a data driver, etc may be disposed in the peripheral region 40.

In example embodiments, the peripheral region 40 surrounding the light emitting region 30 of FIG. 1 may have a uniform width, but not being limited thereto. For example, the peripheral region 40 may include a first region extending in the third direction D3 and a second region extending in a first direction D1 or a second direction D2 that is perpendicular to the third direction D3. In other words, the first region of the peripheral region 40 may be located adjacent to a top of the light emitting region 30 and the bending region 50, and the second region of the peripheral region 40 may be located in both lateral portions of the light emitting region 30 (e.g., left and right sides of the light emitting region 30). Here, a width extending in the third direction D3 of the second region may be relatively less than a width extending in the first direction D1 (or the second direction D2) of the second region. As the bending region 50 is bent, the pad region 60 may be located on a lower surface of the OLED display device 100. In other words, when the pad region 60 is located on the lower surface of the OLED display device 100, the bending region 50 may have a round shape (or a bended shape).

The external device 101 may be electrically connected to the OLED display device 100 through a flexible printed circuit board ("FPCB"). The external device 101 may provide a data signal, a gate signal, a light emission signal, an initialization signal, a power supply, etc to the OLED display device 100. In addition, a driving integrated circuit may be mounted (e.g., installed) on the FPCB. In some example embodiments, the driving integrated circuit may be mounted on the OLED display device 100 that is located adjacent to the pad electrodes 470.

Figure 4:
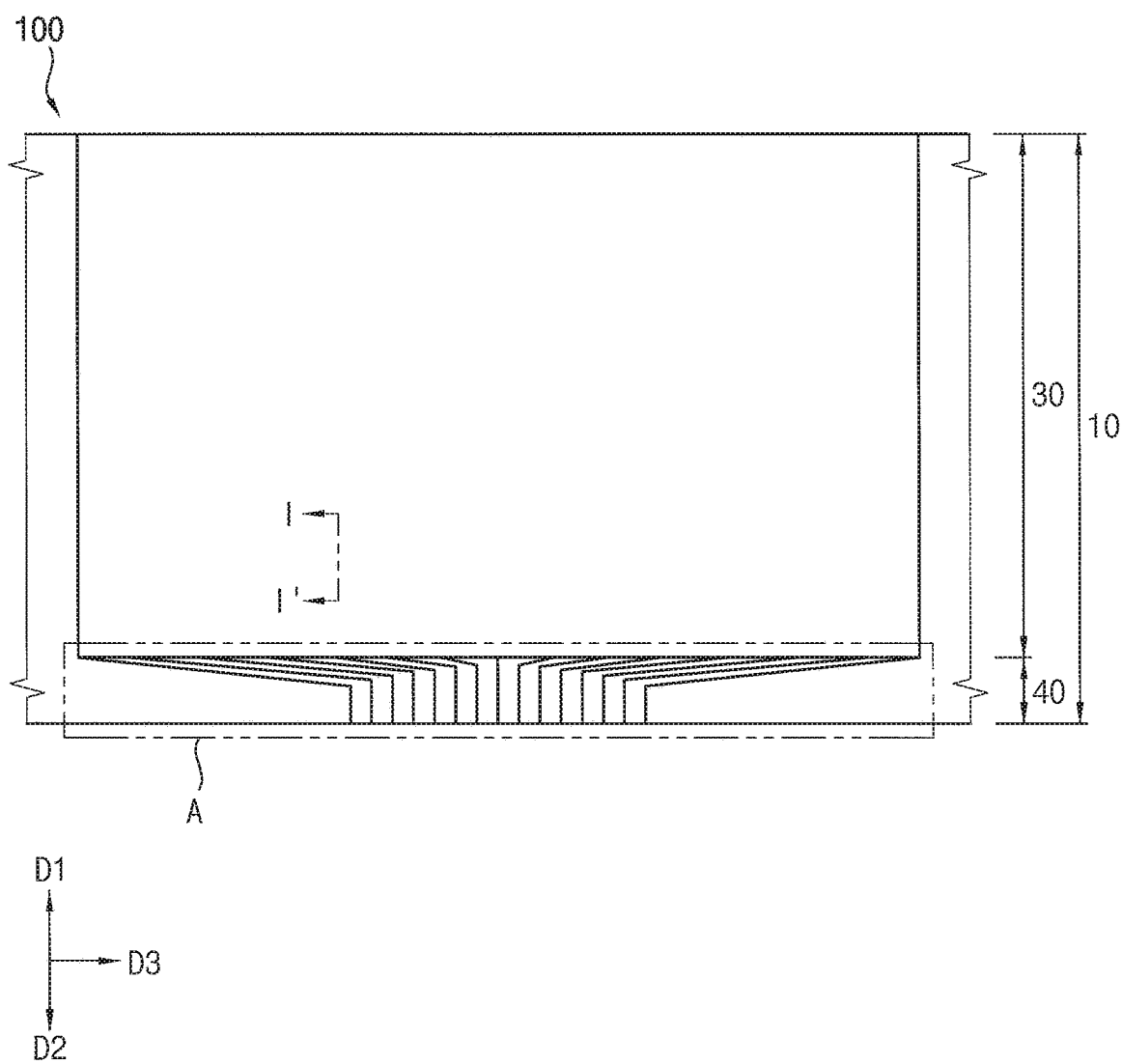
FIG. 4 is a plan view for describing a fan-out wiring included in the OLED display device of FIG. 1.
Figure 5:
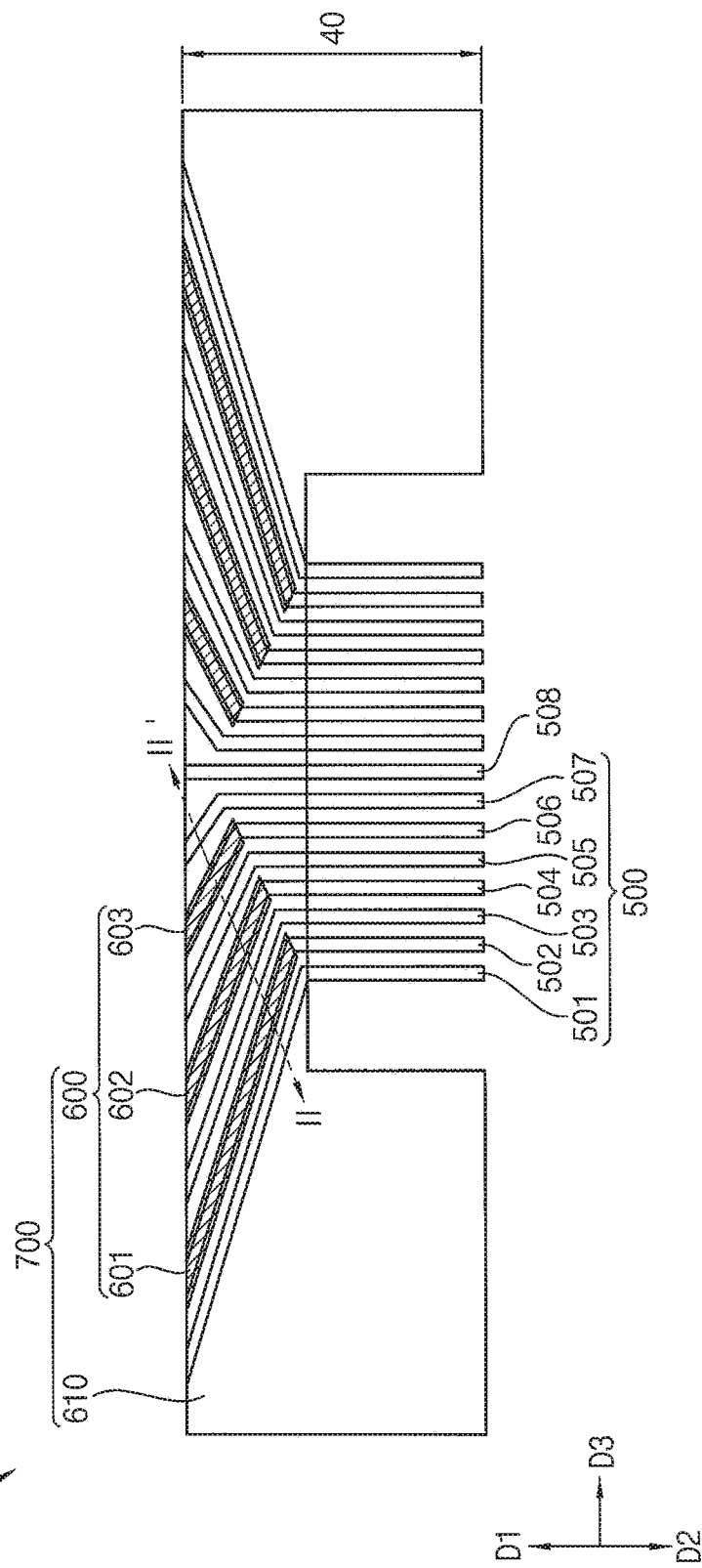
FIG. 5 is an enlarged plan view corresponding to region 'A' of FIG. 4.
Figure 6:
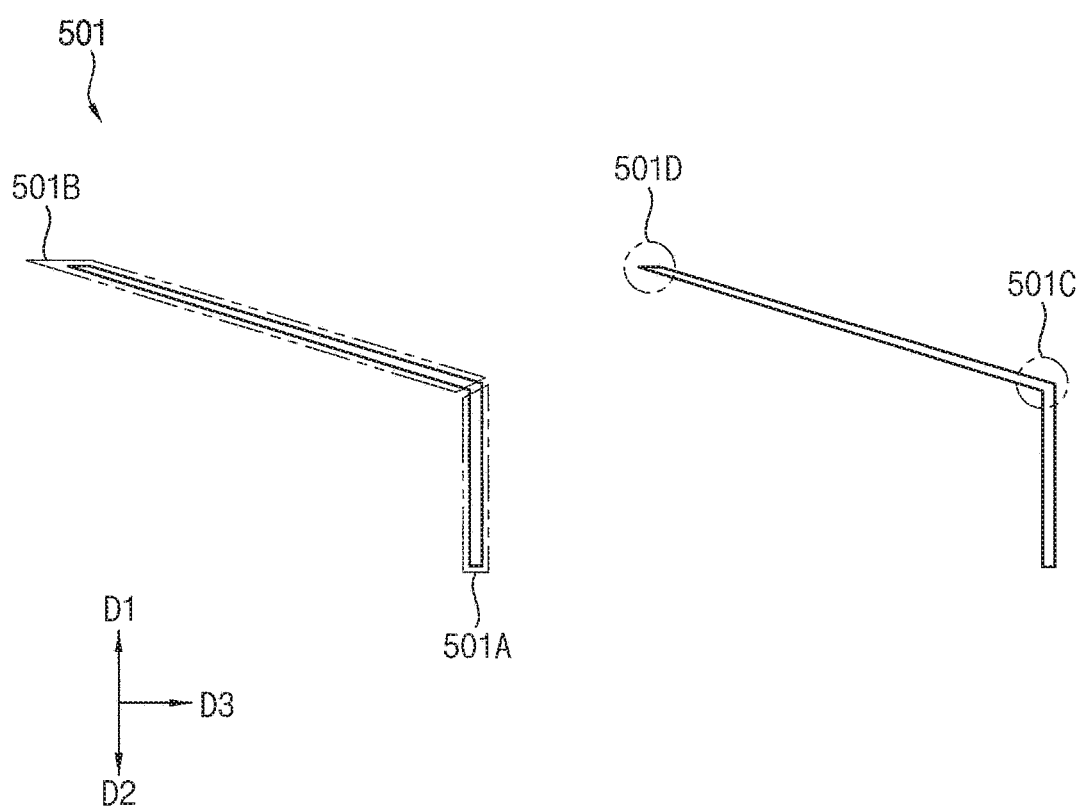
FIG. 6 is a plan view for describing a fan-out wiring included in the OLED display device of FIG. 5.

FIG. 4 is a plan view for describing a fan-out wiring included in the OLED display device of FIG. 1, and FIG. 5 is an enlarged plan view corresponding to region 'A' of FIG. 4. FIG. 6 is a plan view for describing a fan-out wiring included in the OLED display device of FIG. 5.

Referring to FIGS. 4, 5, and 6, the OLED display device 100 may include a substrate, which will be described below, a plurality of fan-out wirings 500 and a wiring structure 700, etc. Here the fan-out wirings 500 may include first, second, third, fourth, fifth, sixth, and seventh fan-out wirings 501, 502, 503, 504, 505, 506, and 507 (e.g., the first fan-out wiring group). For convenience of description, the fan-out wirings 500 include the first through seventh fan-out wirings 501, 502, 503, 504, 505, 506, and 507 in FIG. 5, but the fan-out wirings 500 may further include substantially an eighth fan-out wiring 508 and seven fan-out wirings (e.g., a second fan-out wiring group) as well as the first fan-out wiring group. Here, the first fan-out wiring group and the second fan-out wiring group may be substantially symmetrical to each other with respect to the eighth fan-out wiring 508. That is, the fan-out wirings 500 may include fifteen fan-out wirings. For convenience of descriptions, it is assumed that the fan-out wirings 500 include the first fan-out wiring group. In example embodiments, the data signal may be applied to the fan-out wirings 500.

The wiring structure 700 may include a conductive layer 610 and conductive patterns 600. The conductive patterns 600 may include first, second, and third conductive patterns 601, 602, and 603 (e.g., a first conductive pattern group). For convenience of description, the conductive patterns 600 include the first through third conductive patterns 601, 602, and 603 in FIG. 5, but the conductive patterns 600 may further include a second conductive pattern group including three conductive patterns as well as the first conductive pattern group. Here, the first conductive pattern group and the second conductive pattern group may be substantially symmetrical to each other with respect to the eighth fan-out wiring 508. That is, the conductive patterns 600 may include six conductive patterns. For convenience of description, it is assumed that the conductive patterns 600 include first conductive pattern group. In example embodiments, the power supply (e.g., a high voltage) may be applied to the wiring structure 700.

The fan-out wirings 500 may be disposed in the peripheral region 40 (e.g., the peripheral region 40 located between the light emitting region 30 and the bending region 50) on the substrate. Each of the fan-out wirings 500 may have a straight-line portion and an oblique line portion. However, the fan-out wiring in the middle (the eighth fan-out wiring 508) may not have an oblique line portion. The straight-line portion may extend in the first direction D1 from the pad region 60 into the display region 10, and the oblique line portion may extend in a direction that is different from the first direction D1. Here, the straight-line portion and the oblique line portion may be integrally formed. In addition, the oblique line portion may have a first distal end connected to the straight-line portion and a second distal end that is aligned to one side of the light emitting region 30. The second distal end of the oblique line portion may be connected to a data wiring disposed in the light emitting region 30, and the data wiring may be connected to the light emitting structures 200. Accordingly, the data signal may be applied to the light emitting structures 200.

For example, referring to the first fan-out wiring 501 illustrated in a left side of FIG. 6, the first fan-out wiring 501 may have a straight-line portion 501A and an oblique line portion 501B. The straight-line portion 501A may extend from the pad region 60 in the first direction D1, and the oblique line portion 501B may extend in a direction that is different from the first direction D1. Here, the straight-line portion 501A and the oblique line portion 501B may be integrally formed. In addition, referring to the first fan-out wiring 501 illustrated in a right side of FIG. 6, the oblique line portion 501B may have a first distal end 501C connected to the straight-line portion 501A and a second distal end 501D that is aligned to one side of the light emitting region 30.

In this way, each of the second through seventh fan-out wirings 502, 503, 504, 505, 506, and 507 may have a straight-line portion, an oblique line portion, a first distal end, and a second distal end.

In example embodiments, the fan-out wirings 500 may include lower fan-out wirings and upper fan-out wirings. For example, the lower fan-out wirings may include first, third, fifth, and seventh fan-out wirings 501, 503, 505, and 507, and the upper fan-out wirings may include second, fourth, and sixth fan-out wirings 502, 504, and 506. The upper fan-out wirings may be disposed on the lower fan-out wirings. The upper fan-out wirings and lower fan-out wirings might not overlap each other, and may be alternately disposed.

In example embodiments, the fan-out wirings 500 include seven fan-out wirings, but not being limited thereto. For example, in some example embodiments, the fan-out wirings 500 may include at least eight fan-out wirings.

In other words, the fan-out wirings may include first through (N)th fan-out wirings, where N is an integer greater than 1. (K)th and (K+1)th fan-out wirings among the first through (N)th fan-out wirings may be located at different layers, and may not overlap each other, where K is an integer between 1 and N.

The wiring structure 700 may be disposed in the peripheral region 40 on the fan-out wirings 500. In example embodiments, the conductive layer 610 may cover the fan-out wirings 500, and may be disposed on the fan-out wirings 500. For example, the conductive layer 610 may completely cover each of the oblique line portions of the fan-out wirings 500. A portion of each of the straight-line portions of the fan-out wirings 500 may be covered by the conductive layer 610 and a remaining portion of each of the straight-line portion of the fan-out wirings 500 may be exposed. Alternatively, the conductive layer 610 may completely cover the oblique line portions of the fan-out wirings 500 and the straight-line portions of the fan-out wirings 500.

The conductive patterns 600 spaced apart from each other may be disposed on the conductive layer 610. In example embodiments, the conductive patterns 600 may be in direct contact with the conductive layer 610, and may overlap one of the upper fan-out wirings or the lower fan-out wirings. For example, the first conductive pattern 601 may be disposed on the second fan-out wiring 502 to completely overlap the second fan-our wiring, and the second conductive pattern 602 may be disposed on the fourth fan-out wiring 504 to completely overlap the fourth fan-our wiring. The third conductive pattern 603 may be disposed on the sixth fan-out wiring 506 to completely overlap the sixth fan-our wiring. Alternatively, the conductive patterns 600 might not overlap the upper fan-out wirings, and may overlap the lower fan-out wirings. In some example embodiments, the conductive patterns 600 may completely overlap the upper and lower fan-out wirings, respectively, and may be spaced apart from each other.

In example embodiments, the conductive patterns 600 include three conductive patterns, but not being limited thereto. For example, in some example embodiments, the conductive patterns 600 may include at least four conductive patterns.

In addition, in example embodiments, each of the conductive patterns 600 overlaps only the oblique line portion of the fan-out wiring, but not being limited thereto. For example, in some example embodiments, each of the conductive patterns 600 overlaps both the oblique line portion and the straight-line portion of the fan-out wiring.

In other words, the conductive patterns may include first through (M)th conductive patterns, where M is an integer greater than 1. A (J)th conductive pattern among the first through (M)th conductive patterns may be disposed on the (K)th fan-out wirings, and the (J)th conductive pattern might not overlap the (K+1)th fan-out wiring, where J is an integer between 1 and M.

In a conventional OLED display device, a power supply wiring may be disposed on the peripheral region 40 on the fan-out wirings such that a power is applied to the light emitting structures 200 disposed on the light emitting region 30. The power supply wiring may include a first conductive layer and a second conductive layer, and the second conductive layer may be disposed on the first conductive layer. The second conductive layer may overlap the first conductive layer in a plan view. In other words, the second conductive layer may cover the first conductive layer, and may be disposed along a profile of the first conductive layer. In this case, a step may be generated on the second conductive layer, and light incident from an outside (e.g., an external light) may be irregularly reflected due to the step. For example, the second conductive layer may have the step of a V shape because of fan-out wirings disposed under the first conductive layer. Although a polarizing layer is disposed on the second conductive layer, the external light might not completely disappear in the polarizing layer because the external light is irregularly reflected from the step of the V shape. The step of the V shape may be viewed by a user of the conventional OLED display device. That is, visibility of the conventional OLED display device may be reduced.

The conductive patterns 600 may be disposed on the conductive layer 610 such that the OLED display device 100 according to example embodiments prevents a diffused reflection phenomenon generated by the wirings in the peripheral region 40. For example, as the conductive patterns 600 spaced apart from each other are disposed on the conductive layer 610, a step of a V shape might not be formed in the conductive patterns 600. Although the external light is reflected from the conductive patterns 600 and the conductive layer 610, the external light may disappear by a polarizing layer disposed on the wiring structure 700. Accordingly, visibility of the OLED display device 100 may be relatively improved.

Figure 7:
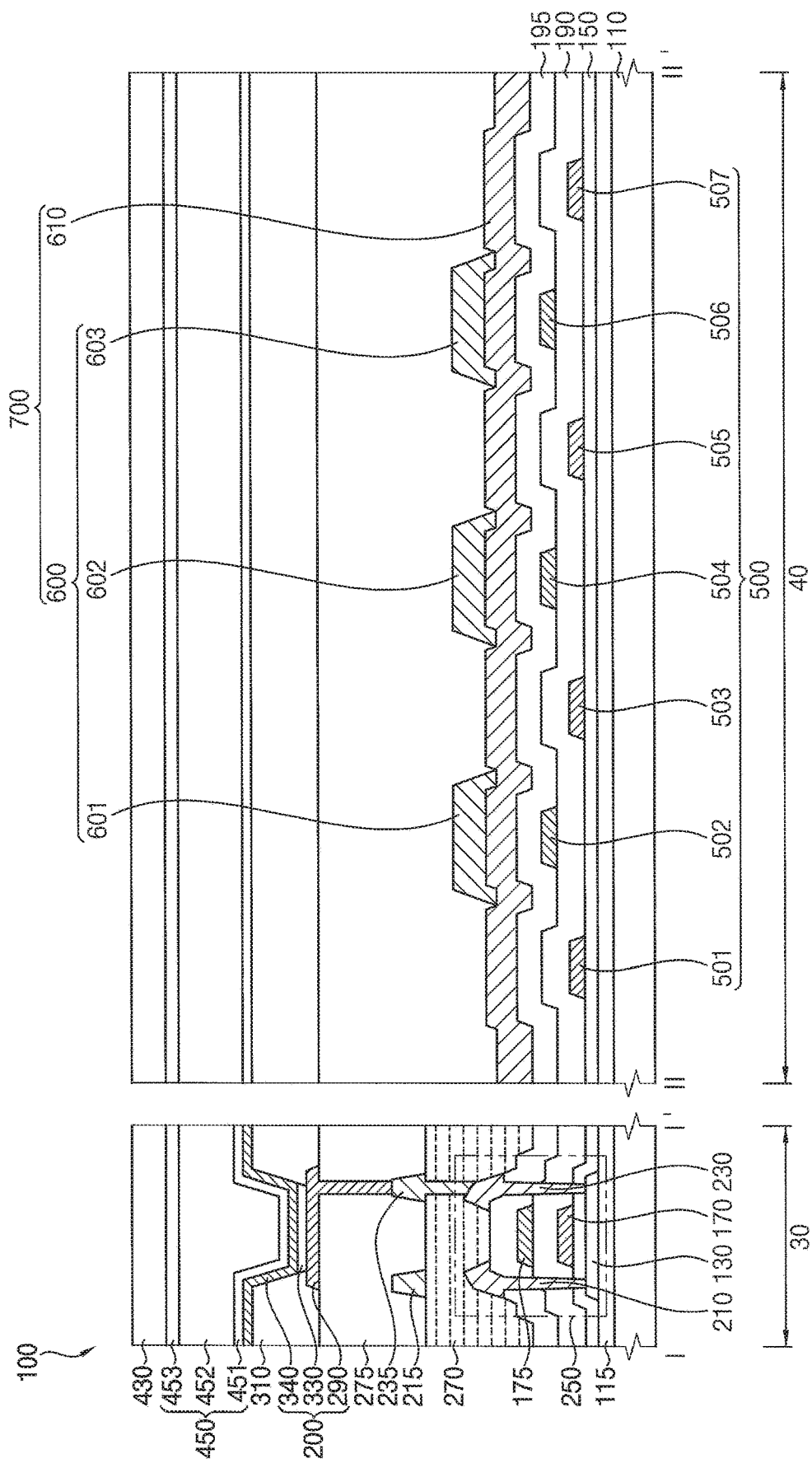
FIG. 7 is a cross-sectional view taken along lines I-I' and II-II' of FIGS. 4 and 5.

FIG. 7 is a cross-sectional view taken along lines I-I' and II-II' of FIGS. 4 and 5.

Referring to FIG. 7, the OLED display device 100 may include a substrate 110, a buffer layer 115, a semiconductor element 250, a light emitting structure 200, a fan-out wirings 500, a wiring structure 700, a first planarization layer 270, a second planarization layer 275, a wiring pattern 215, a connection pattern 235, a pixel defining layer 310, a thin film encapsulation ("TFE") structure 450, a polarizing layer 430, etc. Here, the semiconductor element 250 may include an active layer 130, a gate insulation layer 150, a first gate electrode 170, a first insulating interlayer 190, a second gate electrode 175, a second insulating interlayer 195, a source electrode 210, and a drain electrode 230. The fan-out wirings 500 may include first through seventh fan-out wirings 501, 502, 503, 504, 505, 506, and 507. In addition, the wiring structure 700 may include conductive patterns 600 and a conductive layer 610, and the conductive patterns 600 may include first, second, and third conductive patterns 601, 602, and 603. Here, the first, third, fifth, and seventh fan-out wirings 501, 503, 505, and 507 may be defined as lower fan-out wirings, and the second, fourth, and sixth fan-out wirings 502, 504, and 506 may be defined as upper fan-out wirings. Further, the light emitting structure 200 may include a lower electrode 290, a light emitting layer 330, and an upper electrode 340, and the TFE structure 450 may include a first TFE layer 451, a second TFE layer 452, and a third TFE layer 453.

As described above, as the OLED display device 100 includes the substrate 110 and the TFE structure 450 that have flexibility and a bending region 50 is bent on an axis with respect to a third direction D3, the OLED display device 100 may serve as a flexible OLED display device having a bending region 50 that may be bent.

The substrate 110 may include transparent or opaque insulation materials. The substrate 110 may include a flexible transparent resin substrate. In example embodiments, the substrate 110 may have a configuration where a first organic layer, a first barrier layer, a second organic layer, and a second barrier layer are sequentially stacked. The first barrier layer and the second barrier layer each may include inorganic materials such as silicon oxide, and may block moisture or water that is permeated through the first and second organic layers. The first organic layer and the second organic layer each may include organic materials such as a polyimide-based resin.

Since the substrate 110 is relatively thin and flexible, the substrate 110 may be disposed on a rigid glass substrate which supports the flexible substrate when forming the semiconductor element 250 and the light emitting structure

200. In a manufacturing the OLED display device 100, after the buffer layer 115 is provided on the second barrier layer of the substrate 110, the semiconductor element 250 and the light emitting structure 200 may be disposed on the buffer layer 115. After the semiconductor element 250 and the light emitting structure 200 are formed on the buffer layer 115, the rigid glass substrate on which the substrate 110 is disposed may be removed. In other words, it may be difficult to directly form the semiconductor element 250 and the light emitting structure 200 on the substrate 110 because the substrate 110 is relatively thin and flexible. Accordingly, the semiconductor element 250 and the light emitting structure 200 are formed on the substrate 110 and the rigid glass substrate, and then the substrate 110 including the first organic layer, the first barrier layer, the second organic layer, and the second barrier layer may serve as the substrate 110 of the OLED display device 100 after the removal of the rigid glass substrate.

As the OLED display device 100 has a display region 10 including a light emitting region 30 and a peripheral region 40, the bending region 50, and a pad region 60, as illustrated in FIG. 7, the substrate 110 may be divided into the light emitting region 30, the peripheral region 40 (e.g., the peripheral region 40 located between the light emitting region 30 and the bending region 50 of FIG. 1), the bending region 50, and the pad region 60 (refer to FIG. 1).

Alternatively, the substrate 110 may include a quartz substrate, a synthetic quartz substrate, a calcium fluoride substrate, a fluoride-doped quartz substrate, a soda-lime glass substrate, a non-alkali glass substrate etc.

In example embodiments, the substrate 110 includes four-layers, but not being limited thereto. For example, in some example embodiments, the substrate 110 may include a single layer or a plurality of layers.

The buffer layer 115 may be disposed on the substrate 110. In example embodiments, the buffer layer 115 may be entirely disposed in the light emitting region 30 and the peripheral region 40 on the substrate 110. The buffer layer 115 may prevent a diffusion of metal atoms and/or impurities from the substrate 110 into the semiconductor element 250. In addition, the buffer layer 115 may control a rate of a heat transfer in a crystallization process for forming the active layer 130, thereby obtaining substantially uniform active layer. Further, the buffer layer 115 may improve a surface flatness of the substrate 110 when a surface of the substrate 110 is relatively irregular. In some example embodiments, according to a type of the substrate 110, at least two buffer layers 115 may be provided on the substrate 110, or the buffer layer may not be disposed. The buffer layer 115 may include silicon compound, metal oxide, etc. For example, the buffer layer 115 may include silicon oxide (SiOx), silicon nitride (SiNx), silicon oxynitride (SiOxNy), silicon oxycarbide (SiOxCy), silicon carbon nitride (SiCxNy), aluminum oxide (AlOx), aluminum nitride (AlNx), tantalum oxide (TaOx), hafnium oxide (HfOx), zirconium oxide (ZrOx), titanium oxide (TiOx), etc.

The active layer 130 may be disposed in the light emitting region 30 on the buffer layer 115. The active layer 130 may include an oxide semiconductor, an inorganic semiconductor (e.g., amorphous silicon, polysilicon, etc.), an organic semiconductor, etc.

The gate insulation layer 150 may be disposed on the active layer 130. The gate insulation layer 150 may cover the active layer 130 in the light emitting region 30 on the buffer layer 115, and may extend in a second direction D2 from the light emitting region 30 into the pad region 60. In example embodiments, the gate insulation layer 150 may cover the active layer 130 on the buffer layer 115, and may be disposed as a substantially uniform thickness along a profile of the active layer 130. In addition, the gate insulation layer 150 may be entirely disposed in the light emitting region 30 and the peripheral region 40 on the buffer layer 115. Alternatively, the gate insulation layer 150 may sufficiently cover the active layer 130 on the buffer layer 115, and may have a substantially flat upper surface without a step around the active layer 130. The gate insulation layer 150 may include silicon compound, metal oxide, etc.

The first gate electrode 170 may be disposed in the light emitting region 30 on the gate insulation layer 150. The first gate electrode 170 may be disposed on a portion of the gate insulation layer 150 under which the active layer 130 is located. The first gate electrode 170 may include a metal, a metal alloy, metal nitride, conductive metal oxide, transparent conductive materials, etc. These may be used alone or in a suitable combination thereof. In some example embodiments, the first gate electrode 170 may have a multi-layered structure including a plurality of layers.

The first, third, fifth, and seventh fan-out wirings 501, 503, 505, and 507 (e.g., the lower fan-out wirings) may be disposed in the peripheral region 40 on the gate insulation layer 150. The lower fan-out wirings may be spaced apart from each other. For example, cross sections of the first, third, fifth, and seventh fan-out wirings 501, 503, 505, and 507 illustrated in FIG. 7 may correspond to oblique line portions of the first, third, fifth, and seventh fan-out wirings 501, 503, 505, and 507 illustrated in FIG. 5, respectively. In example embodiments, the first gate electrode 170 and the lower fan-out wirings may be located on a same layer, for example on the gate insulation layer 150, and a data signal may be applied to the lower fan-out wirings. Each of the lower fan-out wirings may include a metal, an alloy of a metal, metal nitride, conductive metal oxide, transparent conductive materials, etc. These may be used alone or in a suitable combination thereof. In some example embodiments, each of the lower fan-out wirings may have a multi-layered structure including a plurality of layers.

The first insulating interlayer 190 may be disposed on the first gate electrode 170 and lower fan-out wirings. The first insulating interlayer 190 may cover the first gate electrode 170 in the light emitting region 30 on the gate insulation layer 150, and may extend in the second direction D2. In addition, the first insulating interlayer 190 may cover the lower fan-out wirings in the peripheral region 40 on the gate insulation layer 150. In example embodiments, the first insulating interlayer 190 may cover the first gate electrode 170 and the lower fan-out wirings on the gate insulation layer 150, and may be disposed as a substantially uniform thickness along a profile of the first gate electrode 170 and the lower fan-out wirings. In the peripheral region 40, the first insulating interlayer 190 may have a step because of the lower fan-out wirings disposed under the first insulating interlayer 190. Alternatively, the first insulating interlayer 190 may sufficiently cover the first gate electrode 170 and the lower fan-out wirings on the gate insulation layer 150, and may have a substantially flat upper surface without a step around the first gate electrode 170 and the lower fan-out wirings. The first insulating interlayer 190 may include silicon compound, metal oxide, etc.

The second gate electrode 175 may be disposed in the light emitting region 30 on the first insulating interlayer 190. The second gate electrode 175 may be disposed on a portion of the first insulating interlayer 190 under which the first gate electrode 170 is located. Alternatively, the first gate electrode 170 and the second gate electrode 175 may serve as a storage capacitor. The second gate electrode 175 may include a metal, a metal alloy, metal nitride, conductive metal oxide, transparent conductive materials, etc. These may be used alone or in a suitable combination thereof. In some example embodiments, the second gate electrode 175 may have a multi-layered structure including a plurality of layers.

The second, fourth, and sixth fan-out wirings 502, 504, and 506 (e.g., upper fan-out wirings) may be disposed in the peripheral region 40 on the first insulating interlayer 190. The upper fan-out wirings may be spaced apart from each other such that the upper fan-out wirings do not overlap the lower fan-out wirings. For example, cross sections of the second, fourth, and sixth fan-out wirings 502, 504, and 506 illustrated in FIG. 7 may correspond to oblique line portions of second, fourth, and sixth fan-out wirings 502, 504, and 506 illustrated in FIG. 5, respectively. In example embodiments, the second gate electrode 175 and the upper fan-out wirings may be located on a same layer, for example, the first insulating interlayer 190, and the data signal may be applied to the upper fan-out wirings. Each of the upper fan-out wirings may include a metal, a metal alloy, metal nitride, conductive metal oxide, transparent conductive materials, etc. These may be used alone or in a suitable combination thereof. In some example embodiments, the upper fan-out wirings may have a multi-layered structure including a plurality of layers. Accordingly, the fan-out wirings 500 including the first through seventh fan-out wirings 501, 502, 503, 504, 505, 506, and 507 may be constituted. In some example embodiments, the first through seventh fan-out wirings 501, 502, 503, 504, 505, 506, and 507 may be located on a same layer, and may be spaced apart from each other.

The second insulating interlayer 195 may be disposed on the second gate electrode 175 and the upper fan-out wirings. The second insulating interlayer 195 may cover the second gate electrode 175 in the light emitting region 30 on the first insulating interlayer 190, and may extend in the second direction D2. In addition, the second insulating interlayer 195 may cover the upper fan-out wirings in the peripheral region 40 on the first insulating interlayer 190. In example embodiments, the second insulating interlayer 195 may cover the second gate electrode 175 and the upper fan-out wirings on the first insulating interlayer 190, and may be disposed as a substantially uniform thickness along a profile of the second gate electrode 175 and the upper fan-out wirings. Alternatively, the second insulating interlayer 195 may sufficiently cover the second gate electrode 175 and the upper fan-out wirings on the first insulating interlayer 190, and may have a substantially flat upper surface without a step around the second gate electrode 175 and the upper fan-out wirings. The second insulating interlayer 195 may include a silicon compound, a metal oxide, etc.

The source electrode 210 and the drain electrode 230 may be disposed in the light emitting region 30 on the second insulating interlayer 195. The source electrode 210 may be in direct contact with a source region of the active layer 130 via a contact hole formed by removing a first portion of the gate insulation layer 150, the first insulating interlayer 190, and the second insulating interlayer 195. The drain electrode 230 may be in direct contact with a drain region of the active layer 130 via a contact hole formed by removing second portion of the gate insulation layer 150, the first insulating interlayer 190, and the second insulating interlayer 195. Each of the source electrode 210 and the drain electrode 230 may include a metal, an alloy, metal nitride, conductive metal oxide, transparent conductive materials, etc. These may be used alone or in a suitable combination thereof. In some example embodiments, each of the source and drain electrodes 210 and 230 may have a multi-layered structure including a plurality of layers. Accordingly, the semiconductor element 250 including the active layer 130, the gate insulation layer 150, the first gate electrode 170, the first insulating interlayer 190, the second gate electrode 175, the second insulating interlayer 195, the source electrode 210, and the drain electrode 230 may be constituted.

In example embodiments, the semiconductor element 250 has a top gate structure, but not being limited thereto. For example, in some example embodiments, the semiconductor element 250 may have a bottom gate structure.

In addition, the OLED display device 100 includes one semiconductor element, but not being limited thereto. For example, in some example embodiments, the OLED display device 100 may include at least one semiconductor element and at least one capacitor.

The conductive layer 610 may be disposed in the peripheral region 40 on the second insulating interlayer 195. In example embodiments, the conductive layer 610 may cover the second insulating interlayer 195 in the peripheral region 40, and may be disposed as a substantially uniform thickness along a profile of the second insulating interlayer 195. In addition, the conductive layer 610, the source electrode 210, and the drain electrode 230 may be located on a same layer, and a high voltage may be applied to the conductive layer 610. The conductive layer 610 may include a metal, an alloy, metal nitride, conductive metal oxide, transparent conductive materials, etc. For example, the conductive layer 610 may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Ir), an alloy of aluminum, aluminum nitride (AlNx), an alloy of silver, tungsten nitride (WNx), an alloy of copper, an alloy of molybdenum, titanium nitride (TiNx), chromium nitride (CrNx), tantalum nitride (TaNx), strontium ruthenium oxide (SRO), zinc oxide (ZnOx), indium tin oxide (ITO), stannum oxide (SnOx), indium oxide (InOx), gallium oxide (GaOx), indium zinc oxide (IZO), etc. These may be used alone or in a suitable combination thereof. Alternatively, the conductive layer 610 may have a multi-layered structure including a plurality of layers.

The first planarization layer 270 may be disposed on the second insulating interlayer 195, the source electrode 210, and the drain electrode 230. The first planarization layer 270 may cover the source and drain electrodes 210 and 230 in the light emitting region 30 on the second insulating interlayer 195. In example embodiments, the first planarization layer 270 might not be disposed in the peripheral region 40 on the conductive layer 610. In other words, the first planarization layer 270 may be interposed between the wiring and connection patterns 215 and 235 and the semiconductor element 250 in the light emitting region 30, and might not be interposed between the conductive layer 610 and the conductive patterns 600 in the peripheral region 40. For example, the first planarization layer 270 may be disposed as a high thickness in the light emitting region 30. In this case, the first planarization layer 270 may have a substantially flat upper surface, and a planarization process may be further performed on the first planarization layer 270 to implement the flat upper surface of the first planarization layer 270. Alternatively, the first planarization layer 270 may be disposed as a substantially uniform thickness along a profile of the source and drain electrodes 210 and 230 in the light emitting region 30 on the second insulating interlayer 195. The first planarization layer 270 may include organic materials or inorganic materials. In example embodiments, the first planarization layer 270 may include organic materials such as a photoresist, a polyacryl-based resin, a polyimide-based resin, a polyamide-based resin, a siloxane-based resin, an acryl-based resin, or an epoxy-based resin.

The wiring pattern 215 and the connection pattern 235 may be disposed in the light emitting region 30 on the first planarization layer 270. A gate signal, a data signal, a light emission signal, an initialization signal, a power, etc. may be transferred through the wiring pattern 215. The connection pattern 235 may be spaced apart from the wiring pattern 215 in the light emitting region 30 on the first planarization layer 270. The connection pattern 235 may be in contact with the drain electrode 230 via a contact hole formed by removing a portion of the first planarization layer 270 that is located in the light emitting region 30, and may electrically connect the lower electrode 290 and the drain electrode 230. Alternatively, the connection pattern 235 might not be connected to the drain electrode 230, and may be electrically connected to a semiconductor element, which is different from the semiconductor element 250, in a different cross-sectional view of the OLED display device 100 via a contact hole. Each of the wiring pattern 215 and the connection pattern 235 may include a metal, an alloy of a metal, metal nitride, conductive metal oxide, transparent conductive materials, etc. These may be used alone or in a suitable combination thereof. In some example embodiments, each of the wiring pattern 215 and the connection pattern 235 may have a multi-layered structure including a plurality of layers.

The conductive patterns 600 (e.g., the first, second, and third conductive patterns 601, 602, and 603) may be disposed in the peripheral region 40 on the conductive layer 610. In example embodiments, the first, second, and third conductive patterns 601, 602, and 603 may be spaced apart from each other, and may be in direct contact with the conductive layer 610. That is, the conductive patterns 600 and the conductive layer 610 may be electrically connected. In addition, the first, second, and third conductive patterns 601, 602, and 603 may overlap the upper fan-out wirings, and might not overlap the lower fan-out wirings. For example, the first conductive pattern 601 may overlap the second fan-out wiring 502, and the second conductive pattern 602 may overlap the fourth fan-out wiring 504. The third conductive pattern 603 may overlap the sixth fan-out wiring 506. Alternatively, the conductive patterns 600 might not overlap the upper fan-out wirings, and may overlap the lower fan-out wirings. Further, the conductive patterns 600, the wiring pattern 215, and the connection pattern 235 may be simultaneously (or concurrently) formed using same materials, and the high voltage may be applied to the conductive patterns 600. Each of the conductive patterns 600 may include a metal, an alloy of a metal, metal nitride, conductive metal oxide, transparent conductive material, etc. These may be used alone or in a suitable combination thereof. In some example embodiments, each of the conductive patterns 600 may have a multi-layered structure including a plurality of layers. Accordingly, the wiring structure 700 including the conductive patterns 600 and the conductive layer 610 may be constituted.

In example embodiments, as the conductive patterns 600 are spaced apart from each other on the conductive layer 610, a step of a V shape might not be formed in the conductive patterns 600. Although an external light is reflected from the conductive patterns 600 and the conductive layer 610, the external light may disappear (or be removed) by the polarizing layer 430 disposed on the wiring structure 700.

The second planarization layer 275 may be disposed on the wiring pattern 215, the connection pattern 235, the wiring structure 700, and the first planarization layer 270. The second planarization layer 275 may cover the wiring pattern 215 and the connection pattern 235 in the light emitting region 30 on the first planarization layer 270 and extend in the second direction D2, and may cover the wiring structure 700 in the peripheral region 40. That is, the second planarization layer 275 may be disposed on the entire substrate 110. The second planarization layer 275 disposed on the light emitting region 30 may be thicker than the second planarization layer 275 disposed on the peripheral region 40. Alternatively, the second planarization layer 275 may be disposed only in the light emitting region 30 on the first planarization layer 270, and might not be disposed in the peripheral region 40 on the wiring structure 700. The second planarization layer 275 may be disposed as a high thickness to sufficiently cover the wiring pattern 215, the connection pattern 235, and the wiring structure 700. In this case, the second planarization layer 275 may have a substantially flat upper surface, and a planarization process may be further performed on the second planarization layer 275 to implement the flat upper surface of the second planarization layer 275. Alternatively, the second planarization layer 275 may cover the wiring pattern 215, the connection pattern 235, and the wiring structure 700, and may be disposed as a substantially uniform thickness along a profile of the wiring pattern 215, the connection pattern 235, and the wiring structure 700. The second planarization layer 275 may include organic materials or inorganic materials. In example embodiments, the second planarization layer 275 may include organic materials.

The lower electrode 290 may be disposed in the light emitting region 30 on the second planarization layer 275. The lower electrode 290 may be in contact with the connection pattern 235 via a contact hole formed by removing a portion of the second planarization layer 275. In addition, the lower electrode 290 may be electrically connected to the semiconductor element 250. The lower electrode 290 may include a metal, a metal alloy, metal nitride, conductive metal oxide, transparent conductive materials, etc. These may be used alone or in a suitable combination thereof. In some example embodiments, the lower electrode 290 may have a multi-layered structure including a plurality of layers.

The pixel defining layer 310 may be disposed in the light emitting region 30 on the second planarization layer 275 and expose a portion of the lower electrode 290, and may extend in the second direction D2. In other words, the pixel defining layer 310 may cover both lateral portions of the lower electrode 290 and extend in the second direction D2, and may be disposed in the peripheral region 40 on the second planarization layer 275. Alternatively, the pixel defining layer 310 may be disposed only in the light emitting region 30, and might not be disposed in the peripheral region 40. The pixel defining layer 310 may include organic materials or inorganic materials. In example embodiments, the pixel defining layer 310 may include organic materials.

The light emitting layer 330 may be disposed on a portion of the lower electrode 290 exposed by the pixel defining layer 310. The light emitting layer 330 may be formed using at least one of light emitting materials capable of generating different colors of light (e.g., a red color of light, a blue color of light, and a green color of light, etc) according to sub-pixels. Alternatively, the light emitting layer 330 may generally generate a white color of light by stacking a plurality of light emitting materials capable of generating different colors of light such as a red color of light, a green color of light, a blue color of light, etc. In this case, a color filter may be disposed on the light emitting layer 330. The color filter may include at least one selected from a red color filter, a green color filter, and a blue color filter. Alternatively, the color filter may include a yellow color filter, a cyan color filter, and a magenta color filter. The color filter may include a photosensitive resin, a color photoresist, etc.

The upper electrode 340 may be disposed in the light emitting region 30 on the pixel defining layer 310 and the light emitting layer 330. The upper electrode 340 may include a metal, a metal alloy, metal nitride, conductive metal oxide, transparent conductive materials, etc. These may be used alone or in a suitable combination thereof. In some example embodiments, the upper electrode 340 may have a multi-layered structure including a plurality of layers. Accordingly, the light emitting structure 200 including the lower electrode 290, the light emitting layer 330, and the upper electrode 340 may be constituted.

The first TFE layer 451 may be disposed in the light emitting region 30 on the upper electrode 340 and in the peripheral region 40 on the pixel defining layer 310. The first TFE layer 451 may cover the upper electrode 340 in the light emitting region 30, and may be disposed as a substantially uniform thickness along a profile of the upper electrode 340. In addition, the first TFE layer 451 may cover the pixel defining layer 310 in the peripheral region 40, and may be disposed as a substantially uniform thickness along a profile of the pixel defining layer 310. Alternatively, the first TFE layer 451 might not be disposed in the peripheral region 40. The first TFE layer 451 may prevent the light emitting structure 200 from being deteriorated by the permeation of moisture, water, oxygen, etc. In addition, the first TFE layer 451 may protect the light emitting structure 200 from external impacts. The first TFE layer 451 may include inorganic materials having flexibility.

The second TFE layer 452 may be disposed in the light emitting region 30 and the peripheral region 40 on the first TFE layer 451. Alternatively, the second TFE layer 452 might not be disposed in the peripheral region 40. The second TFE layer 452 may improve the flatness of the OLED display device 100, and may protect the light emitting structure 200. The second TFE layer 452 may include organic materials having the flexibility.

The third TFE layer 453 may be disposed in the light emitting region 30 and the peripheral region 40 on the second TFE layer 452. The third TFE layer 453 may cover the second TFE layer 452, and may be disposed as a substantially uniform thickness along a profile of the second TFE layer 452. Alternatively, the third TFE layer 453 might not be disposed in the peripheral region 40. The third TFE layer 453 together with the first TFE layer 451 and the second TFE layer 452 may prevent the light emitting structure 200 from being deteriorated by the permeation of moisture, water, oxygen, etc. In addition, the third TFE layer 453 together with the first TFE layer and the second TFE layer 451 and 452 may protect the light emitting structure 200 from external impacts. The third TFE layer 453 may include inorganic materials having the flexibility. Accordingly, the TFE structure 450 including the first TFE layer 451, the second TFE layer 452, and the third TFE layer 453 may be constituted.

Alternatively, the TFE structure 450 may have five layers structure where first to fifth TFE layers are stacked or seven layers structure where first to seventh TFE layers are stacked.

The polarizing layer 430 may be disposed on the TFE structure 450. The polarizing layer 430 may overlap the light emitting region 30 and the peripheral region 40 on the substrate 110. The polarizing layer 430 may include a linear polarization film and a λ/4 phase retardation film. Here, the λ/4 phase retardation film may be disposed on the TFE structure 450. The λ/4 phase retardation film may convert a phase of a light. For example, the λ/4 phase retardation film may convert linearly polarized light, the light vibrating up and down or the light vibrating left and right, into circularly polarized light, right-circularly polarized light or left-circularly polarized light, respectively. In addition, the λ/4 phase retardation film may convert circularly polarized light, the right-circularly polarized light or the left-circularly polarized light, into linearly polarized light, the light vibrating up and down or the light vibrating left and right, respectively. The λ/4 phase retardation film may include a birefringent film containing polymer, an orientation film of a liquid crystal polymer, alignment layer of a liquid crystal polymer, etc.

The linear polarization film may be disposed on the λ/4 phase retardation film. The linear polarization film may selectively transmit an incident light therethrough. For example, the linear polarization film may transmit the light vibrating up and down or vibrating left and right. In this case, the linear polarization film may include a pattern of horizontal stripes or vertical stripes. When the linear polarization film includes a pattern of horizontal stripes, the linear polarization film may block the light vibrating up and down, and may transmit the light vibrating left and right. When the linear polarization film includes a pattern of vertical stripes, the linear polarization film may block the light vibrating left and right, and may transmit the light vibrating up and down. The light passing through the linear polarization film may passes through the λ/4 phase retardation film. As described above, the λ/4 phase retardation film may convert a phase of the light. For example, when the incident light vibrating up, down, left, and right passes through the linear polarization film, the linear polarization film including a pattern of the horizontal stripes may transmit the light vibrating left and right. When the incident light vibrating left and right passes through the λ/4 phase retardation film, the incident light vibrating left and right may be converted into the left-circularly polarized light. The incident light including the left-circularly polarized light may be reflected at the upper electrode 340 in the light emitting region 30 and the wiring structure 700 in the peripheral region 40, and then the incident light may be converted into the right-circularly polarized light. When the incident light including the right-circularly polarized light passes through the λ/4 phase retardation film, the incident light may be converted into the light vibrating up and down. Here, the light vibrating up and down may be blocked by the linear polarization film including a pattern of the horizontal stripes. Accordingly, the incident light may be removed by the linear polarization film and the λ/4 phase retardation film (i.e., the polarizing layer 430). For example, the linear polarization film may include iodine-based materials, materials containing dye, polyene-based materials, etc.

As the OLED display device 100 in accordance with example embodiments includes the wiring structure 700 including the conductive layer 610 and the conductive patterns 600 that are spaced apart from each other and disposed on the conductive layer 610, the OLED display device 100 may prevent a diffused reflection phenomenon because a step of a V shape is not formed in the conductive patterns 600. That is, although the external light is reflected from the conductive patterns 600 and the conductive layer 610, the external light may be removed by the polarizing layer 430 disposed on the wiring structure 700. Accordingly, visibility of the OLED display device 100 may be relatively improved.

Figure 8:
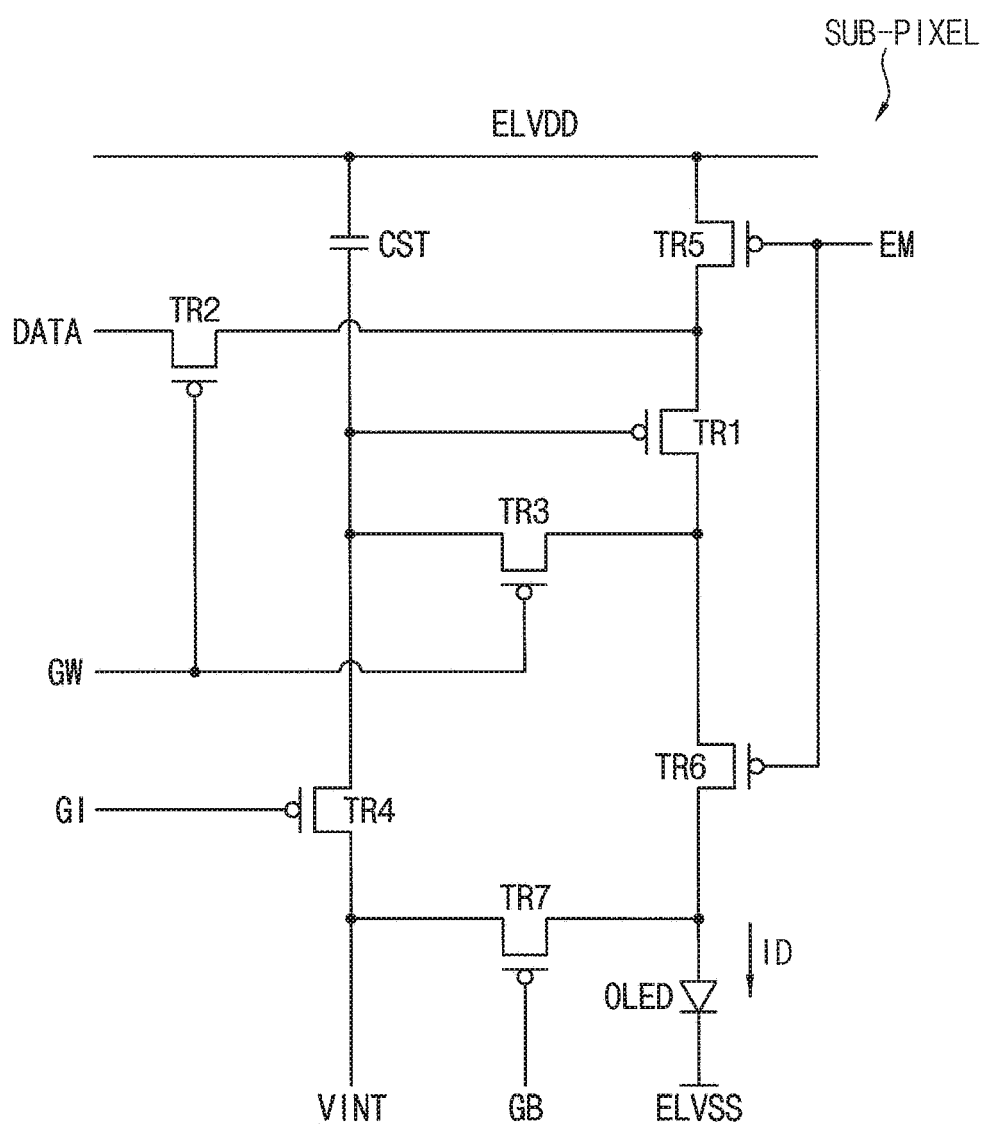
FIG. 8 is a circuit diagram for describing an OLED and transistors included in the OLED display device of FIG. 7.

FIG. 8 is a circuit diagram for describing an OLED and transistors included in the OLED display device of FIG. 7. For example, the OLED display device 100 may include a plurality of sub-pixels, and each of the sub-pixels may correspond to a circuit illustrated in FIG. 8.

Referring to FIG. 8, the OLED display device 100 may include an OLED (e.g., the light emitting structure 200 of FIG. 7), first through seventh transistors TR1, TR2, TR3, TR4, TR5, TR6, and TR7, and a storage capacitor CST, etc.

The OLED may emit light based on a driving current ID. The OLED may include a first terminal and a second terminal. In example embodiments, the second terminal of the OLED receives a low voltage ELVSS. For example, the first terminal of the OLED is an anode terminal, and the second terminal of the OLED is a cathode terminal. Alternatively, the first terminal of the OLED may be a cathode terminal, and the second terminal of the OLED may be an anode terminal. In example embodiments, the anode terminal of the OLED may correspond to the lower electrode 290 of FIG. 7, and the cathode terminal of the OLED may correspond to the upper electrode 340 of FIG. 7.

The first transistor TR1 may include a gate terminal, a first terminal, and a second terminal. In example embodiments, the first terminal of the first transistor TR1 is a source terminal, and the second terminal of the first transistor TR1 is a drain terminal. Alternatively, the first terminal of the first transistor TR1 may be a drain terminal, and the second terminal of the first transistor TR1 may be a source terminal.

The driving current ID may be generated by the first transistor TR1. In example embodiments, the first transistor TR1 operates in a saturation region. In this case, the first transistor TR1 may generate the driving current ID based on a voltage difference of the gate terminal and the source terminal, and a gradation of pixel may be determined according to the amount of the driving current ID generated by the first transistor TR1. Alternatively, the first transistor TR1 operates in a linear region. In this case, a gradation may be determined according to a duration of time during which the first transistor TR1 provides the driving current ID to the OLED within one frame.

The second transistor TR2 may include a gate terminal, a first terminal, and a second terminal. A gate signal GW may be applied to the gate terminal of the second transistor TR2. The first terminal of the second transistor TR2 may receive a data signal DATA. Here, the data signal DATA may be generated from the external device 101, may be applied to the fan-out wirings 500 of FIG. 7 through the pad electrode 470 and the connection electrode 335. That is, the data signal DATA may be provided to the second transistor TR2 through the fan-out wirings 500. The second terminal of the second transistor TR2 may be connected to the first terminal of the first transistor TR1. In example embodiments, the first terminal of the second transistor TR2 is a source terminal, and the second terminal of the second transistor TR2 is a drain terminal. Alternatively, the first terminal of the second transistor TR2 is a drain terminal, and the second terminal of the second transistor TR2 is a source terminal.

The second transistor TR2 may provide the data signal DATA to the first terminal of the first transistor TR1 while the gate signal GW is activated. In this case, the second transistor TR2 operates in a linear region.

The third transistor TR3 may include a gate terminal, a first terminal, and a second terminal. The gate terminals of the third transistor TR3 may receive a gate signal GW. The first terminal of the third transistor TR3 may be connected to the gate terminal of the first transistor TR1. The second terminal of the third transistor TR3 may be connected to the second terminal of the first transistor TR1. For example, the gate signal GW may be generated from a gate driver, and the gate signal GW may be applied to the gate terminal of the third transistor TR3 through a gate wiring. In example embodiments, the first terminal of the third transistor TR3 is a source terminal, and the second terminal of the third transistor TR3 is a drain terminal. Alternatively, the first terminal of the third transistor TR3 may be a drain terminal, and the second terminal of the third transistor TR3 may be a source terminal.

The third transistor TR3 may connect the gate terminal of the first transistor TR1 to the second terminal of the first transistor TR1 while the gate signal GW is activated. In this case, the third transistor TR3 may operate in a linear region. That is, the third transistor TR3 may form a diode connection of the first transistor TR1 while the gate signal GW is activated. Accordingly, a voltage difference between the first terminal of the first transistor TR1 and the gate terminal of the first transistor TR1 may be a threshold voltage of the first transistor TR1. As a result, a sum voltage of the data signal DATA provided to the first terminal of the first transistor TR1 and the voltage difference (i.e., the threshold voltage) may be applied to the gate terminal of the first transistor TR1 while the gate signal GW is activated. Thus, the data signal DATA may be compensated as much as the threshold voltage of the first transistor TR1. The compensated data signal DATA may be applied to the gate terminal of the first transistor TR1. A uniformity of the driving current ID may be improved because of reducing an affect by the threshold voltage of the first transistor TR1.

An initialization voltage wiring where an initialization voltage VINT is provided may be connected to a first terminal of the fourth transistor TR4 and a first terminal of the seventh transistor TR7, and a first terminal of a storage capacitor CST may be connected to the initialization voltage wiring VINT through the fourth transistor TR4.

The fourth transistor TR4 may include a gate terminal, the first terminal, and the second terminal. The gate terminal of the fourth transistor TR4 may receive a gate initialization signal GI. The initialization voltage VINT may be applied to the first terminal of the fourth transistor TR4. The second terminal of the fourth transistor TR4 may be connected to the gate terminal of the first transistor TR1. In example embodiments, the first terminal of the fourth transistor TR4 is a source terminal, and the second terminal of the fourth transistor TR4 is a drain terminal. Alternatively, the first terminal of the fourth transistor TR4 may be a drain terminal, and the second terminal of the fourth transistor TR4 may be a source terminal.

The fourth transistor TR4 may apply the initialization voltage VINT to the gate terminal of the first transistor TR1 while the gate initialization signal GI is activated. In this case, the fourth transistor TR4 may operate in the linear region. Thus, the fourth transistor TR4 may initialize the gate terminal of the first transistor TR1 as the initialization voltage VINT while the gate initialization signal GI is activated. In example embodiments, a voltage level of the initialization voltage VINT is sufficiently lower than a voltage level of the data signal DATA maintained by the storage capacitor CST in a previous frame. The initialization voltage VINT may be applied to the gate terminal of the first transistor TR1 that is a P-channel metal oxide semiconductor ("PMOS") type transistor. In some example embodiments, a voltage level of the initialization voltage VINT is sufficiently higher than the voltage level of the data signal DATA maintained by the storage capacitor CST in a previous frame. The initialization voltage VINT may be applied to the gate terminal of the first transistor TR1 that is an N-channel metal oxide semiconductor ("NMOS") type transistor.

In example embodiments, the gate initialization signal GI is identical to the gate signal GW advanced by one horizontal time period. For example, the gate initialization signal GI is applied to sub-pixels located in a (n)th row among a plurality of sub-pixels included in the OLED display device 100 (where n is an integer greater than 2) is substantially a same as the gate signal GW applied to sub-pixels located in a (n−1)th row among a plurality of the sub-pixels. This is, the gate initialization signal GI that is activated may be applied to the sub-pixels located in the (n)th row among the sub-pixels by applying the gate signal GW that is activated to the sub-pixels located in the (n−1)th row among the sub-pixels. As a result, the gate terminal of the first transistor TR1 included in the sub-pixels located in the (n)th row among the sub-pixels may be initialized as the initialization voltage VINT when the data signal DATA is applied to sub-pixels located in the (n−1)th row among the sub-pixels.

The fifth transistor TR5 may include a gate terminal, a first terminal, and a second terminal. An emission signal EM may be applied to the gate terminal of the fifth transistor TR5. A high voltage ELVDD may be applied to the first terminal of the fifth transistor TR5. The second terminal of the fifth transistor TR5 may be connected to the first terminal of the first transistor TR1. In example embodiments, the first terminal of the fifth transistor TR5 is a source terminal, and the second terminal of the fifth transistor TR5 is a drain terminal. In some example embodiments, the first terminal of the fifth transistor TR5 may be a drain terminal, and the second terminal of the fifth transistor TR5 may be a source terminal.

The fifth transistor TR5 may apply the high voltage ELVDD to the first terminal of the first transistor TR1 while the emission signal EM is activated. On the other hands, the fifth transistor TR5 does not apply the high voltage ELVDD while the emission signal EM is inactivated. In this case, the fifth transistor TR5 may operate in the linear region. The fifth transistor TR5 may apply the high voltage ELVDD to the first terminal of the first transistor TR1 while the emission signal EM is activated such that the first transistor TR1 generates the driving current ID. In addition, the fifth transistor TR5 does not apply the high voltage ELVDD while the emission signal EM is inactivated such that the data signal DATA applied to the first terminal of the first transistor TR1 is applied to the gate terminal of the first transistor TR1. Here, the high voltage ELVDD may be generated from the external device 101, and may be applied to the wiring structure 700 through the pad electrode 470 and the connection electrode 335. That is, the high voltage ELVDD may be provided to the fifth transistor TR5 through the wiring structure 700.

The sixth transistor TR6 (e.g., the semiconductor element 250 of FIG. 7) may include a gate terminal, a first terminal, and a second terminal. The emission signal EM may be applied to the gate terminal of the sixth transistor TR6. The first terminal of the sixth transistor TR6 may be connected to the second terminal of the first transistor TR1. The second terminal of the sixth transistor TR6 may be connected to the first terminal of the OLED. In example embodiments, the first terminal of the sixth transistor TR6 is a source terminal, and the second terminal of the sixth transistor TR6 is a drain terminal. In some example embodiments, the first terminal of the sixth transistor TR6 is a drain terminal, and the second terminal of the sixth transistor TR6 is a source terminal.

The sixth transistor TR6 may provide the driving current ID generated by the first transistor TR1 to the OLED while the emission signal EM is activated. In this case, the sixth transistor TR6 may operate in the linear region. That is, the sixth transistor TR6 may provide the driving current ID generated by the first transistor TR1 to the OLED while the emission signal EM is activated such that the OLED emits light. In addition, the sixth transistor TR6 may disconnect the first transistor TR1 from the OLED while the emission signal EM is inactivated such that the compensated data signal DATA applied to the second terminal of the first transistor TR1 is applied to the gate terminal of the first transistor TR1.

The seventh transistor TR7 may include a gate terminal, a first terminal, and a second terminal. A diode initialization signal GB (e.g., the gate initialization signal GI) may be applied to the gate terminal of the seventh transistor TR7. The initialization voltage VINT may be applied to the first terminal of the seventh transistor TR7. The second terminal of the seventh transistor TR7 may be connected to the first terminal of the OLED. In example embodiments, the first terminal of the seventh transistor TR7 is a source terminal, and the second terminal of the seventh transistor TR7 is a drain terminal. In some example embodiments, the first terminal of the seventh transistor TR7 is a drain terminal, and the second terminal of the seventh transistor TR7 is a source terminal.

The seventh transistor TR7 may apply the initialization voltage VINT to the first terminal of the OLED while the diode initialization signal GB is activated. In this case, the seventh transistor TR7 may operate in the linear region. That is, the seventh transistor TR7 may initialize the first terminal of the OLED as the initialization voltage VINT while the diode initialization signal GB is activated.

Alternatively, the gate initialization signal GI and the diode initialization signal GB are a substantially same signal. An initialization operation of the gate terminal of the first transistor TR1 may do not affect an initialization operation of the first terminal of the OLED. That is, the initialization operation of the gate terminal of the first transistor TR1 and the initialization operation of the first terminal of the OLED may be independent to each other. Therefore, the gate initialization signal GI is used as the diode initialization signal GB, thereby improving the manufacturing efficiency.

The storage capacitor CST may include the first terminal and the second terminal, and may be connected between a high voltage wiring and the gate terminal of the first transistor TR1. For example, the first terminal of the storage capacitor CST may be connected to the gate terminal of the first transistor TR1, and the second terminal of the storage capacitor CST may be connected to the high voltage wiring. The storage capacitor CST may maintain a voltage level of the gate terminal of the first transistor TR1 while the gate signal GW is inactivated. The emission signal EM may be activated while the gate signal GW is inactivated. The driving current ID generated by the first transistor TR1 may be provided to the OLED while the emission signal EM is activated. Therefore, the driving current ID generated by the first transistor TR1 may be provided to the OLED based on the voltage level maintained by the storage capacitor CST.

Figure 9:
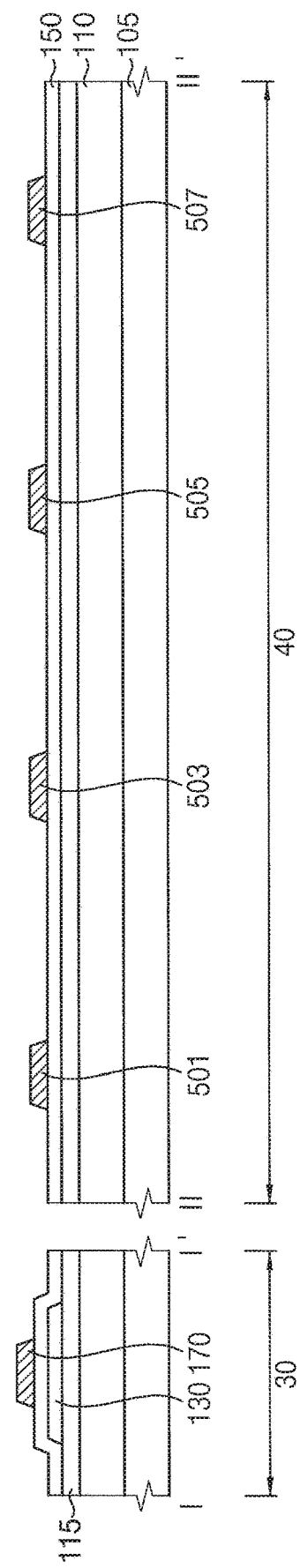
FIGS. 9, 10, 11, 12, 13, 14, 15, 16, 17 and 18 are cross-sectional views and plan views illustrating a method of manufacturing an OLED display device in accordance with example embodiments.
Figure 10:
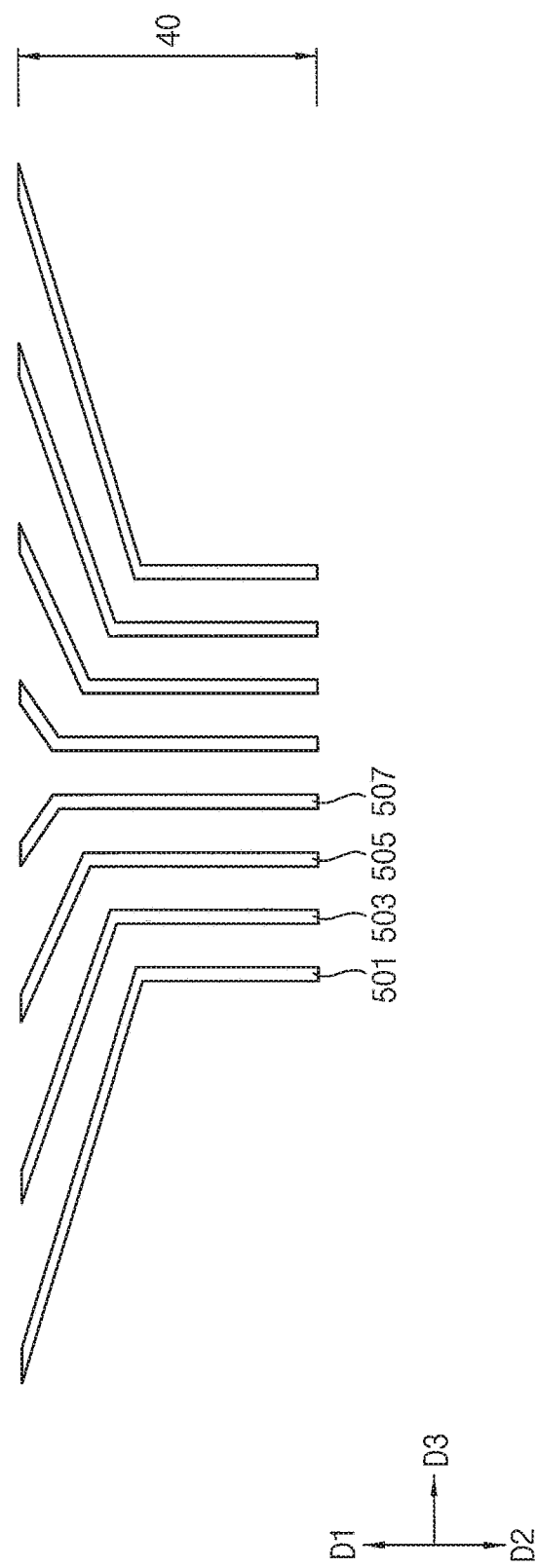
Figure 11:
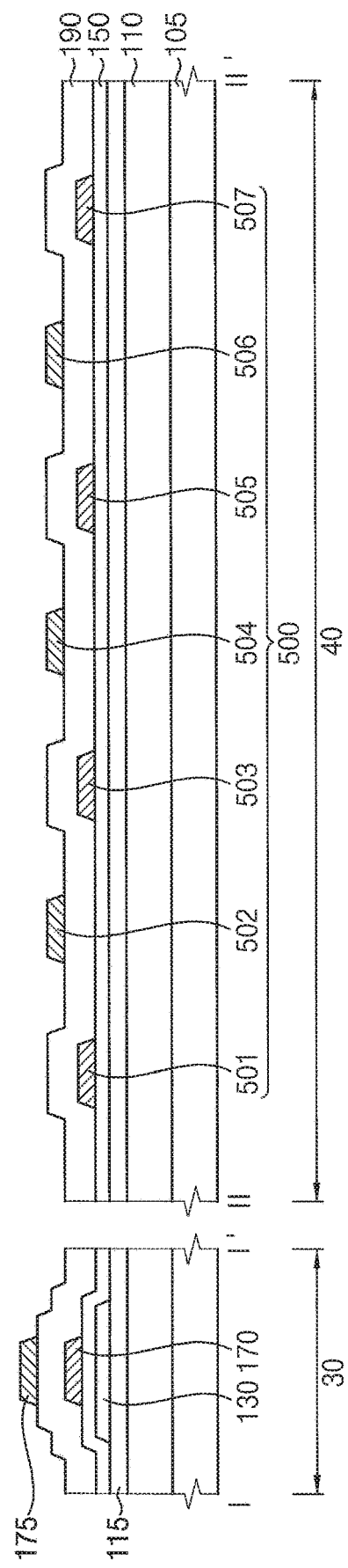
Figure 12:
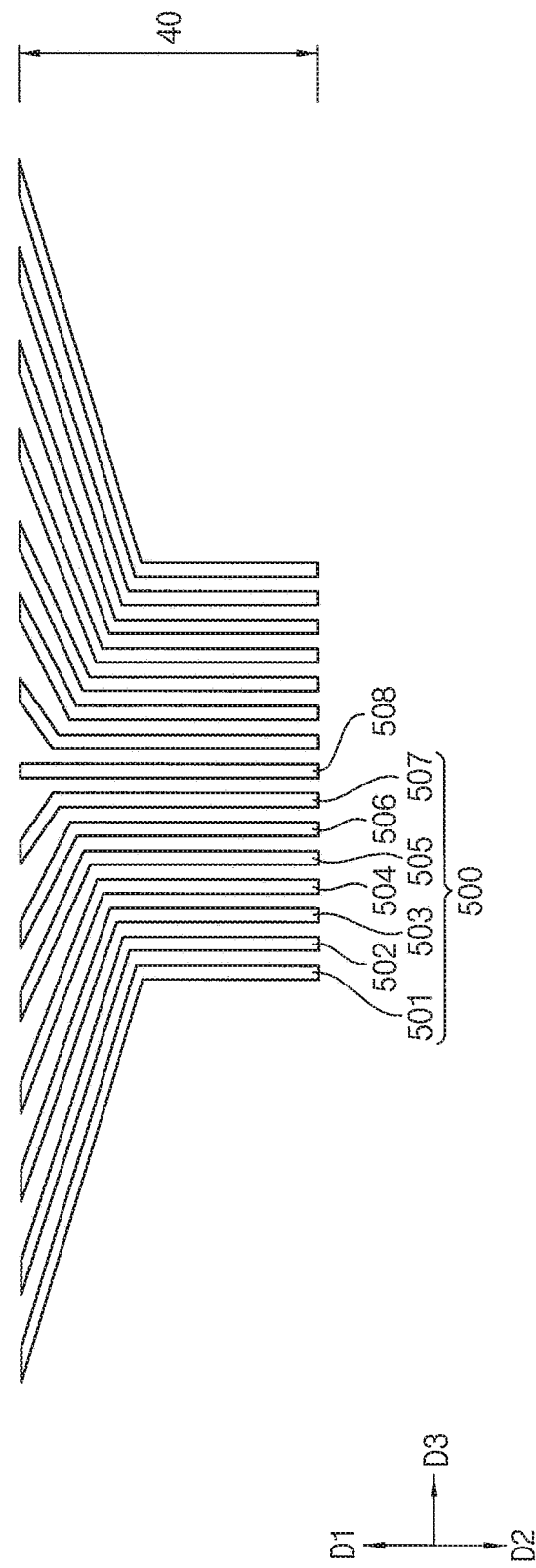
Figure 13:
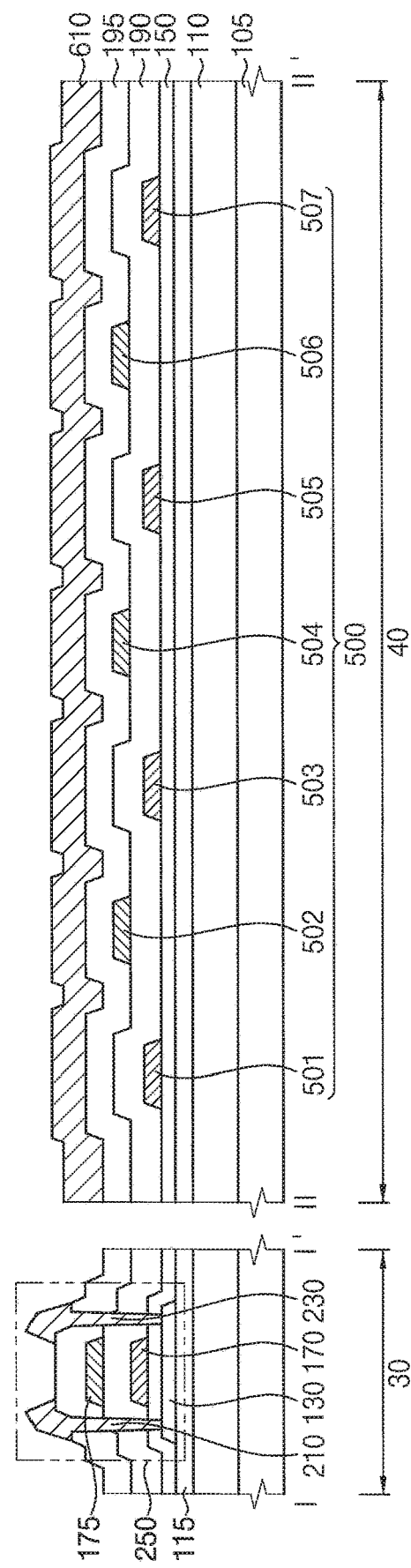
Figure 14:
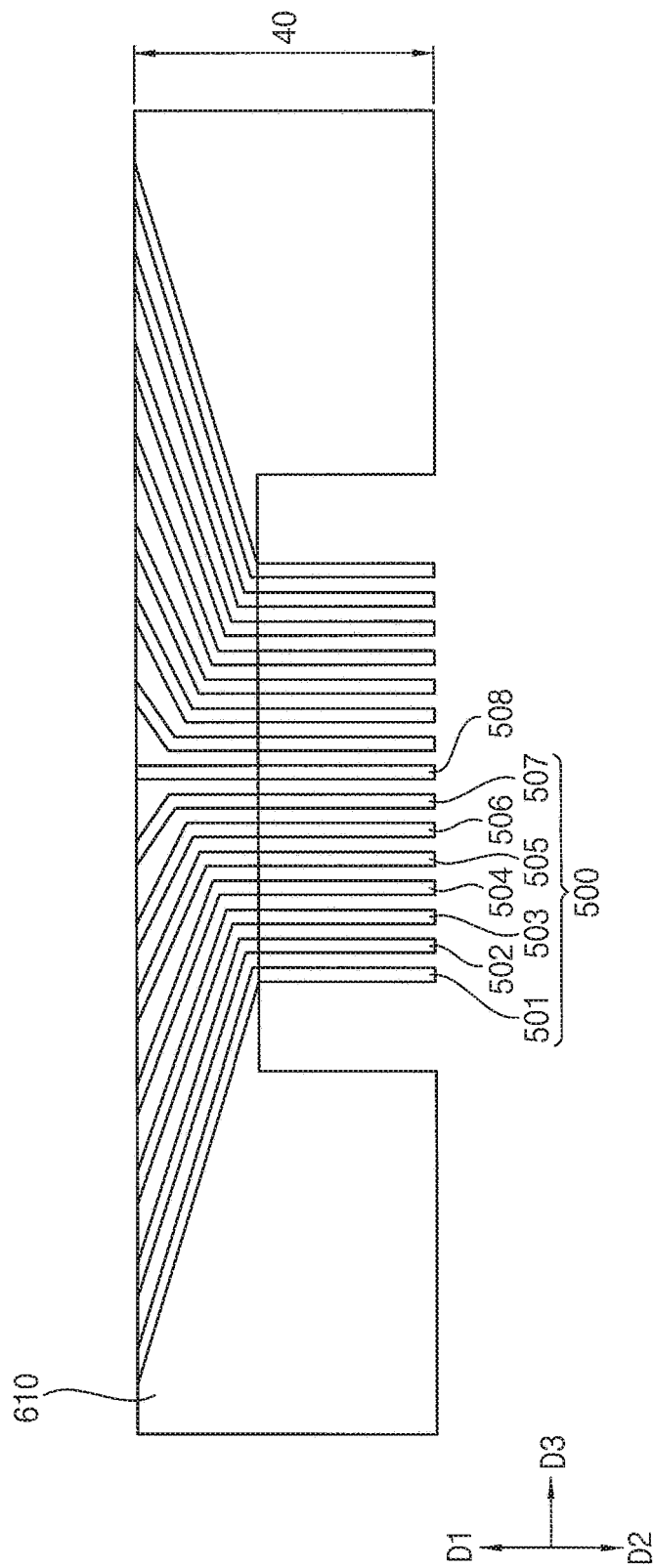
Figure 15:
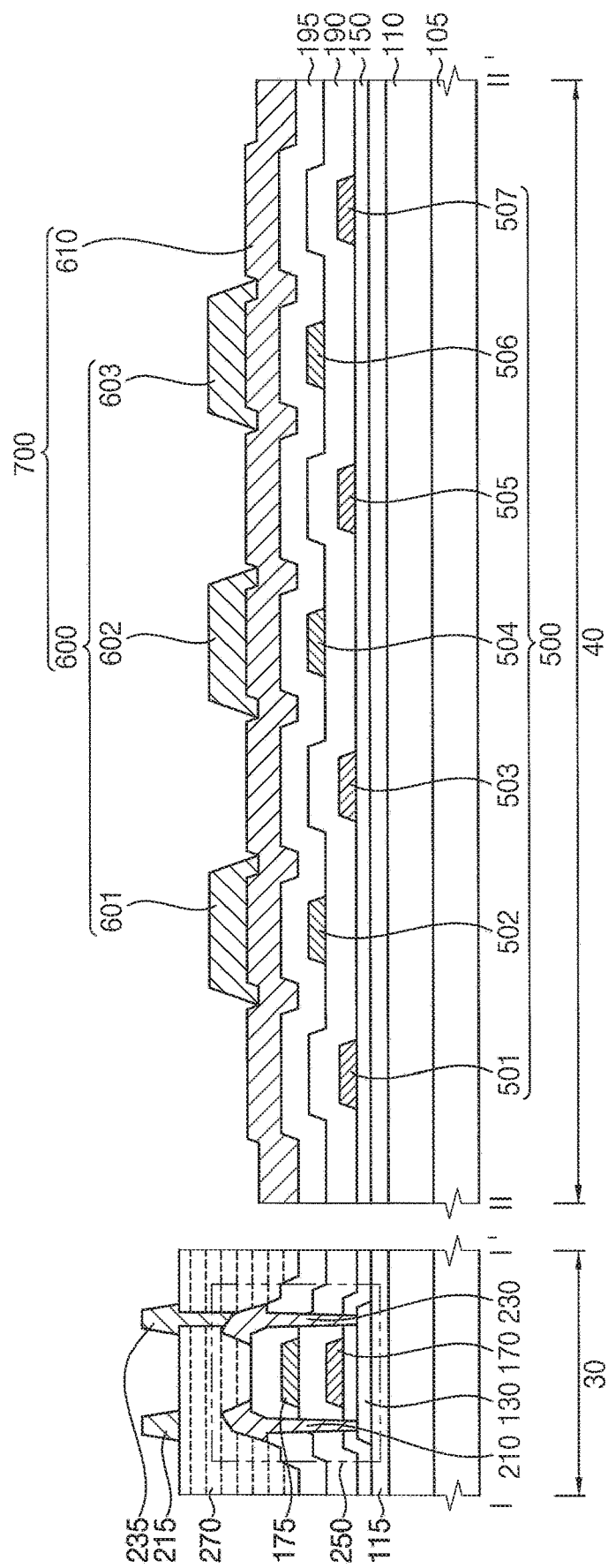
Figure 16:
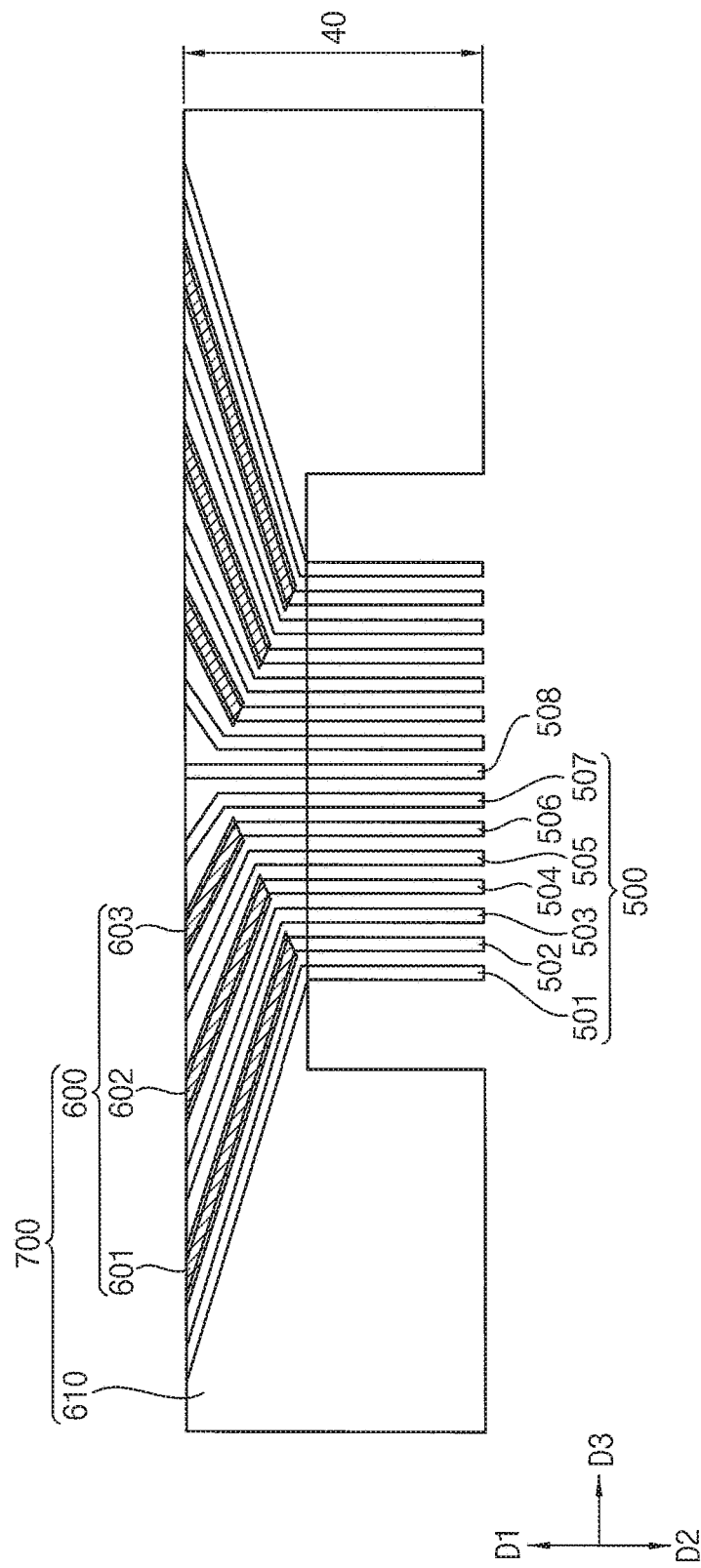

FIGS. 9 through 18 are cross-sectional views illustrating a method of manufacturing an OLED display device in accordance with example embodiments. For example, FIG. 10 is a plan view for describing lower fan-out wirings, and FIG. 12 is a plan view for describing fan-out wirings. FIG. 14 is a plan view for describing fan-out wirings and conductive layer, and FIG. 16 is plan view for describing fan-out wirings and a wiring structure.

Referring to FIG. 9, a rigid glass substrate 105 may be provided. A substrate 110 including transparent or opaque insulation materials may be formed on the glass substrate 105. The substrate 110 may be formed using a flexible transparent material such as a flexible transparent resin substrate. In example embodiments, the substrate 110 may have a configuration where a first organic layer, a first barrier layer, a second organic layer, and a second barrier layer are sequentially stacked. The first barrier layer and the second barrier layer each may be formed using inorganic materials such as silicon oxide, and may block moisture or water that is permeated through the first and second organic layers. The first organic layer and the second organic layer each may be formed using organic materials such as a polyimide-based resin.

A buffer layer 115 may be formed on the substrate 110. In example embodiments, the buffer layer 115 may be entirely formed in a light emitting region 30 and a peripheral region 40 on the substrate 110. According to a type of the substrate 110, at least two buffer layers 115 may be provided on the substrate 110, or the buffer layer may not be formed. The buffer layer 115 may include silicon compound, metal oxide, etc. For example, the buffer layer 115 may include SiOx, SiNx, SiOxNy, SiOxCy, SiCxNy, AlOx, AlNx, TaOx, HfOx, ZrOx, TiOx, etc.

An active layer 130 may be formed in the light emitting region 30 on the buffer layer 115. The active layer 130 may be formed using an oxide semiconductor, an inorganic semiconductor, an organic semiconductor, etc.

A gate insulation layer 150 may be formed on the active layer 130. The gate insulation layer 150 may cover the active layer 130 in the light emitting region 30 on the buffer layer 115, and may extend in a second direction D2. In example embodiments, the gate insulation layer 150 may cover the active layer 130 on the buffer layer 115, and may be formed as a substantially uniform thickness along a profile of the active layer 130. In addition, the gate insulation layer 150 may be entirely formed in the light emitting region 30 and the peripheral region 40 on the buffer layer 115. The gate insulation layer 150 may be formed using silicon compound, metal oxide, etc.

A first gate electrode 170 may be formed in the light emitting region 30 on the gate insulation layer 150. The first gate electrode 170 may be formed on a portion of the gate insulation layer 150 under which the active layer 130 is located. The first gate electrode 170 may be formed using a metal, a metal alloy, metal nitride, conductive metal oxide, transparent conductive materials, etc. These may be used alone or in a suitable combination thereof. In some example embodiments, the first gate electrode 170 may have a multi-layered structure including a plurality of layers.

First, third, fifth, and seventh fan-out wirings 501, 503, 505, and 507 (e.g., lower fan-out wirings) may be formed in the peripheral region 40 on the gate insulation layer 150. The lower fan-out wirings may be spaced apart from each other. In example embodiments, the first gate electrode 170 and the lower fan-out wirings may be located on a same layer, and may be simultaneously formed using same materials. For example, after a first preliminary electrode layer is formed on the entire gate insulation layer 150, the first gate electrode 170 and the lower fan-out wirings may be formed by selectively etching the first preliminary electrode layer. Each of the lower fan-out wirings may be formed using a metal, an alloy of a metal, metal nitride, conductive metal oxide, transparent conductive materials, etc. These may be used alone or in a suitable combination thereof. In some example embodiments, each of the lower fan-out wirings may have a multi-layered structure including a plurality of layers.

Referring to FIG. 10, each of the first, third, fifth, and seventh fan-out wirings 501, 503, 505, and 507 may have a straight-line portion and an oblique line portion (refer to FIGS. 5 and 6). The straight-line portion may extend in a first direction D1, and the oblique line portion may extend in a direction that is different from the first direction D1. Here, the straight-line portion and the oblique line portion may be integrally formed. In addition, the oblique line portion may have a first distal end connected to the straight-line portion and a second distal end that is aligned to one side of the light emitting region 30. For example, referring to the first fan-out wiring 501 illustrated in a left side of FIG. 6, the first fan-out wiring 501 may have a straight-line portion 501A and an oblique line portion 501B. The straight-line portion 501A may extend from a pad region 60 in the first direction D1, and the oblique line portion 501B may extend in a direction that is different from the first direction D1. Here, the straight-line portion 501A and the oblique line portion 501B may be integrally formed. In addition, referring to the first fan-out wiring 501 illustrated in a right side of FIG. 6, the oblique line portion 501B may have a first distal end 501C connected to the straight-line portion 501A and a second distal end 501D that is aligned to one side of the light emitting region 30. In this way, each of the third, fifth, and seventh fan-out wirings 503, 505, and 507 may have a straight-line portion, an oblique line portion, a first distal end, and a second distal end.

Referring to FIG. 11, a first insulating interlayer 190 may be formed on the first gate electrode 170 and lower fan-out wirings. The first insulating interlayer 190 may cover the first gate electrode 170 in the light emitting region 30 on the gate insulation layer 150, and may extend in the second direction D2. In addition, the first insulating interlayer 190 may cover the lower fan-out wirings in the peripheral region 40 on the gate insulation layer 150. In example embodiments, the first insulating interlayer 190 may cover the first gate electrode 170 and the lower fan-out wirings on the gate insulation layer 150, and may be formed as a substantially uniform thickness along a profile of the first gate electrode 170 and the lower fan-out wirings. In the peripheral region 40, the first insulating interlayer 190 may have a step because of the lower fan-out wirings formed under the first insulating interlayer 190. The first insulating interlayer 190 may be formed using silicon compound, metal oxide, etc.

A second gate electrode 175 may be formed in the light emitting region 30 on the first insulating interlayer 190. The second gate electrode 175 may be formed on a portion of the first insulating interlayer 190 under which the first gate electrode 170 is located. The second gate electrode 175 may be formed using a metal, a metal alloy, metal nitride, conductive metal oxide, transparent conductive materials, etc. These may be used alone or in a suitable combination thereof. In some example embodiments, the second gate electrode 175 may have a multi-layered structure including a plurality of layers.

Second, fourth, and sixth fan-out wirings 502, 504, and 506 (e.g., upper fan-out wirings) may be formed in the peripheral region 40 on the first insulating interlayer 190. The upper fan-out wirings may be spaced apart from each other such that the upper fan-out wirings do not overlap the lower fan-out wirings. In example embodiments, the second gate electrode 175 and the upper fan-out wirings may be located on a same layer, and may be simultaneously formed using same materials. For example, after a second preliminary electrode layer is formed on the entire first insulating interlayer 190, the second gate electrode 175 and the upper fan-out wirings may be formed by selectively etching the second preliminary electrode layer. Each of the upper fan-out wirings may be formed using a metal, a metal alloy, metal nitride, conductive metal oxide, transparent conductive materials, etc. These may be used alone or in a suitable combination thereof. In some example embodiments, the upper fan-out wirings may have a multi-layered structure including a plurality of layers. Accordingly, fan-out wirings 500 including the first through seventh fan-out wirings 501, 502, 503, 504, 505, 506, and 507 may be formed.

Referring to FIG. 12, each of the second, fourth, and sixth fan-out wirings 502, 504, and 506 may have a straight-line portion and an oblique line portion (refer to FIGS. 5 and 6). The straight-line portion may extend in the first direction D1, and the oblique line portion may extend in a direction that is different from the first direction D1. Here, the straight-line portion and the oblique line portion may be integrally formed. In addition, the oblique line portion may have a first distal end connected to the straight-line portion and a second distal end that is aligned to one side of the light emitting region 30. Meanwhile, an eighth fan-out wiring 508 may have only a straight-line portion.

Referring to FIG. 13, a second insulating interlayer 195 may be formed on the second gate electrode 175 and the upper fan-out wirings. The second insulating interlayer 195 may cover the second gate electrode 175 in the light emitting region 30 on the first insulating interlayer 190, and may extend in the second direction D2. In addition, the second insulating interlayer 195 may cover the upper fan-out wirings in the peripheral region 40 on the first insulating interlayer 190. In example embodiments, the second insulating interlayer 195 may cover the second gate electrode 175 and the upper fan-out wirings on the first insulating interlayer 190, and may be formed as a substantially uniform thickness along a profile of the second gate electrode 175 and the upper fan-out wirings. The second insulating interlayer 195 may be formed using a silicon compound, a metal oxide, etc.

A source electrode 210 and a drain electrode 230 may be formed in the light emitting region 30 on the second insulating interlayer 195. The source electrode 210 may be in direct contact with a source region of the active layer 130 via a contact hole formed by removing a first portion of the gate insulation layer 150, the first insulating interlayer 190, and the second insulating interlayer 195. The drain electrode 230 may be in direct contact with a drain region of the active layer 130 via a contact hole formed by removing second portion of the gate insulation layer 150, the first insulating interlayer 190, and the second insulating interlayer 195. Each of the source electrode 210 and the drain electrode 230 may be formed using a metal, an alloy, metal nitride, conductive metal oxide, transparent conductive materials, etc. These may be used alone or in a suitable combination thereof. In some example embodiments, each of the source and drain electrodes 210 and 230 may have a multi-layered structure including a plurality of layers. Accordingly, a semiconductor element 250 including the active layer 130, the gate insulation layer 150, the first gate electrode 170, the first insulating interlayer 190, the second gate electrode 175, the second insulating interlayer 195, the source electrode 210, and the drain electrode 230 may be formed.

A conductive layer 610 may be formed in the peripheral region 40 on the second insulating interlayer 195. In example embodiments, the conductive layer 610 may cover the second insulating interlayer 195 in the peripheral region 40, and may be formed as a substantially uniform thickness along a profile of the second insulating interlayer 195. In addition, the conductive layer 610, the source electrode 210, and the drain electrode 230 may be located on a same layer, and may be simultaneously formed using same materials. For example, after a third preliminary electrode layer is formed on the entire second insulating interlayer 195, the source electrode 210, the drain electrode 230, and conductive layer 610 may be formed by selectively etching the third preliminary electrode layer. The conductive layer 610 may be formed using a metal, an alloy, metal nitride, conductive metal oxide, transparent conductive materials, etc. For example, the conductive layer 610 may include Au, Ag, Al, Pt, Ni, Ti, Pd, Mg, Ca, Li, Cr, Ta, W, Cu, Mo, Sc, Nd, Ir, an alloy of aluminum, AlNx, an alloy of silver, WNx, an alloy of copper, an alloy of molybdenum, TiNx, CrNx, TaNx, SRO, ZnOx, ITO, SnOx, InOx, GaOx, IZO, etc. These may be used alone or in a suitable combination thereof. Alternatively, the conductive layer 610 may have a multi-layered structure including a plurality of layers.

Referring to FIG. 14, the conductive layer 610 may cover the fan-out wirings 500, and may be formed on the fan-out wirings 500. For example, the conductive layer 610 may completely cover each of the oblique line portions of the fan-out wirings 500. A portion of each of the straight-line portions of the fan-out wirings 500 may be covered by the conductive layer 610, and a remaining portion of each of the straight-line portion of the fan-out wirings 500 may be exposed. Alternatively, the conductive layer 610 may completely cover the oblique line portions of the fan-out wirings 500 and the straight-line portions of the fan-out wirings 500.

Referring to FIG. 15, a first planarization layer 270 may be formed on the second insulating interlayer 195, the source electrode 210, and the drain electrode 230. The first planarization layer 270 may cover the source and drain electrodes 210 and 230 in the light emitting region 30 on the second insulating interlayer 195. In example embodiments, the first planarization layer 270 might not be formed in the peripheral region 40 on the conductive layer 610. For example, the first planarization layer 270 may be formed as a high thickness in the light emitting region 30. In this case, the first planarization layer 270 may have a substantially flat upper surface, and a planarization process may be further performed on the first planarization layer 270 to implement the flat upper surface of the first planarization layer 270. In example embodiments, the first planarization layer 270 may be formed using organic materials such as a photoresist, a polyacryl-based resin, a polyimide-based resin, a polyamide-based resin, a siloxane-based resin, an acryl-based resin, or an epoxy-based resin.

A wiring pattern 215 and a connection pattern 235 may be formed in the light emitting region 30 on the first planarization layer 270. The connection pattern 235 may be spaced apart from the wiring pattern 215 in the light emitting region 30 on the first planarization layer 270. The connection pattern 235 may be in contact with the drain electrode 230 via a contact hole formed by removing a portion of the first planarization layer 270 that is located in the light emitting region 30. Each of the wiring pattern 215 and the connection pattern 235 may be formed using a metal, an alloy of a metal, metal nitride, conductive metal oxide, transparent conductive materials, etc. These may be used alone or in a suitable combination thereof. In some example embodiments, each of the wiring pattern 215 and the connection pattern 235 may have a multi-layered structure including a plurality of layers.

Conductive patterns 600 (e.g., first, second, and third conductive patterns 601, 602, and 603) may be formed in the peripheral region 40 on the conductive layer 610. In example embodiments, the first, second, and third conductive patterns 601, 602, and 603 may be spaced apart from each other, and may be in direct contact with the conductive layer 610. That is, the conductive patterns 600 and the conductive layer 610 may be electrically connected. In addition, the first, second, and third conductive patterns 601, 602, and 603 may overlap the upper fan-out wirings, and might not overlap the lower fan-out wirings. For example, the first conductive pattern 601 may overlap the second fan-out wiring 502, and the second conductive pattern 602 may overlap the fourth fan-out wiring 504. The third conductive pattern 603 may overlap the sixth fan-out wiring 506. Alternatively, the conductive patterns 600 might not overlap the upper fan-out wirings, and may overlap the lower fan-out wirings. Further, the conductive patterns 600, the wiring pattern 215, and the connection pattern 235 may be simultaneously formed using same materials. After a fourth preliminary electrode layer is entirely formed on the first planarization layer 270 and the conductive layer 610, the conductive patterns 600, the wiring pattern 215, and the connection pattern 235 may be formed by selectively etching the fourth preliminary electrode layer. Each of the conductive patterns 600 may be formed using a metal, an alloy of a metal, metal nitride, conductive metal oxide, transparent conductive material, etc. These may be used alone or in a suitable combination thereof. In some example embodiments, each of the conductive patterns 600 may have a multi-layered structure including a plurality of layers. Accordingly, a wiring structure 700 including the conductive patterns 600 and the conductive layer 610 may be formed.

Referring to FIG. 16, the conductive patterns 600 may be spaced apart from each other on the conductive layer 610. In example embodiments, the conductive patterns 600 may be in direct contact with the conductive layer 610, and may overlap the upper fan-out wirings. For example, the first conductive pattern 601 may be formed on the second fan-out wiring 502, and the second conductive pattern 602 may be formed on the fourth fan-out wiring 504. The third conductive pattern 603 may be formed on the sixth fan-out wiring 506.

Figure 17:
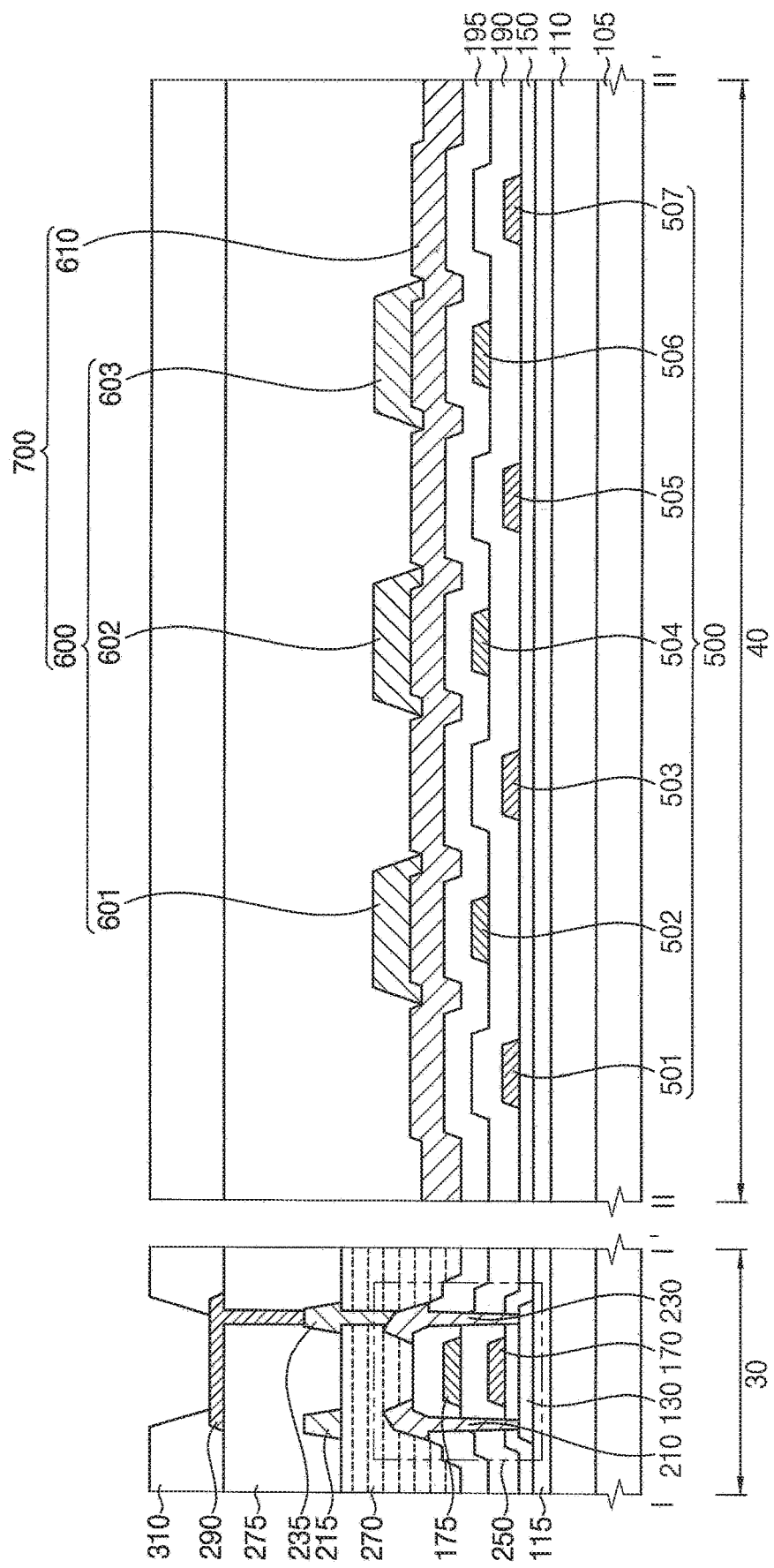

Referring to FIG. 17, a second planarization layer 275 may be formed on the wiring pattern 215, the connection pattern 235, the wiring structure 700, and the first planarization layer 270. The second planarization layer 275 may cover the wiring pattern 215 and the connection pattern 235 in the light emitting region 30 on the first planarization layer 270 and extend in the second direction D2, and may cover the wiring structure 700 in the peripheral region 40. That is, the second planarization layer 275 may be formed on the entire substrate 110. The second planarization layer 275 in the peripheral region 40 may be thicker than that in the light emitting region 30. Alternatively, the second planarization layer 275 may be formed only in the light emitting region 30 on the first planarization layer 270, and might not be formed in the peripheral region 40 on the second planarization layer 275. The second planarization layer 275 may be formed as a high thickness to sufficiently cover the wiring pattern 215, the connection pattern 235, and the wiring structure 700. In this case, the second planarization layer 275 may have a substantially flat upper surface, and a planarization process may be further performed on the second planarization layer 275 to implement the flat upper surface of the second planarization layer 275. In example embodiments, the second planarization layer 275 may be formed using organic materials.

A lower electrode 290 may be formed in the light emitting region 30 on the second planarization layer 275. The lower electrode 290 may be in contact with the connection pattern 235 via a contact hole formed by removing a portion of the second planarization layer 275. In addition, the lower electrode 290 may be electrically connected to the semiconductor element 250. The lower electrode 290 may be formed using a metal, a metal alloy, metal nitride, conductive metal oxide, transparent conductive materials, etc. These may be used alone or in a suitable combination thereof. In some example embodiments, the lower electrode 290 may have a multi-layered structure including a plurality of layers.

A pixel defining layer 310 may be formed in the light emitting region 30 on the second planarization layer 275 and expose a portion of the lower electrode 290, and may extend in the second direction D2. In other words, the pixel defining layer 310 may cover both lateral portions of the lower electrode 290 and extend in the second direction D2, and may be formed in the peripheral region 40 on the second planarization layer 275. In example embodiments, the pixel defining layer 310 may be formed using organic materials.

Figure 18:
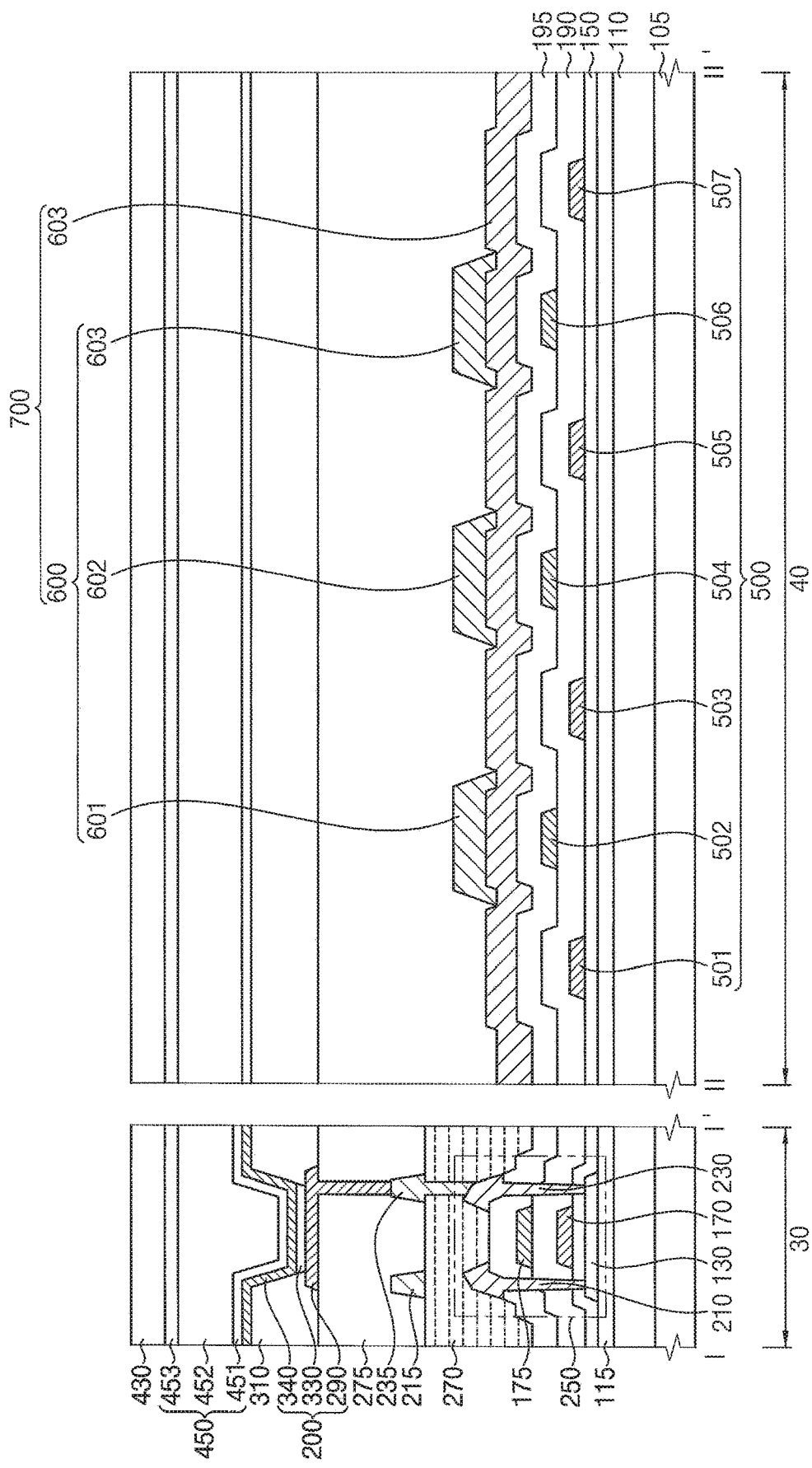

Referring to FIG. 18, a light emitting layer 330 may be formed on a portion of the lower electrode 290 exposed by the pixel defining layer 310. The light emitting layer 330 may be formed using at least one of light emitting materials capable of generating different colors of light (e.g., a red color of light, a blue color of light, and a green color of light, etc) according to sub-pixels. Alternatively, the light emitting layer 330 may generally generate a white color of light by stacking a plurality of light emitting materials capable of generating different colors of light such as a red color of light, a green color of light, a blue color of light, etc. In this case, a color filter may be formed on the light emitting layer 330. The color filter may include at least one selected from a red color filter, a green color filter, and a blue color filter. Alternatively, the color filter may include a yellow color filter, a cyan color filter, and a magenta color filter. The color filter may be formed using a photosensitive resin, a color photoresist, etc.

An upper electrode 340 may be formed in the light emitting region 30 on the pixel defining layer 310 and the light emitting layer 330. The upper electrode 340 may be formed using a metal, a metal alloy, metal nitride, conductive metal oxide, transparent conductive materials, etc. These may be used alone or in a suitable combination thereof. In some example embodiments, the upper electrode 340 may have a multi-layered structure including a plurality of layers. Accordingly, a light emitting structure 200 including the lower electrode 290, the light emitting layer 330, and the upper electrode 340 may be formed.

A first TFE layer 451 may be formed in the light emitting region 30 on the upper electrode 340 and in the peripheral region 40 on the pixel defining layer 310. The first TFE layer 451 may cover the upper electrode 340 in the light emitting region 30, and may be formed as a substantially uniform thickness along a profile of the upper electrode 340. In addition, the first TFE layer 451 may cover the pixel defining layer 310 in the peripheral region 40, and may be formed as a substantially uniform thickness along a profile of the pixel defining layer 310. The first TFE layer 451 may prevent the light emitting structure 200 from being deteriorated by the permeation of moisture, water, oxygen, etc. In addition, the first TFE layer 451 may protect the light emitting structure 200 from external impacts. The first TFE layer 451 may be formed using inorganic materials having flexibility.

A second TFE layer 452 may be formed in the light emitting region 30 and the peripheral region 40 on the first TFE layer 451. The second TFE layer 452 may improve the flatness of the OLED display device 100, and may protect the light emitting structure 200. The second TFE layer 452 may be formed using organic materials having the flexibility.

The third TFE layer 453 may be formed in the light emitting region 30 and the peripheral region 40 on the second TFE layer 452. The third TFE layer 453 may cover the second TFE layer 452, and may be formed as a substantially uniform thickness along a profile of the second TFE layer 452. The third TFE layer 453 together with the first TFE layer 451 and the second TFE layer 452 may prevent the light emitting structure 200 from being deteriorated by the permeation of moisture, water, oxygen, etc. In addition, the third TFE layer 453 together with the first TFE layer 451 and the second TFE layer 452 may protect the light emitting structure 200 from external impacts. The third TFE layer 453 may be formed using inorganic materials having the flexibility. Accordingly, a TFE structure 450 including the first TFE layer 451, the second TFE layer 452, and the third TFE layer 453 may be formed.

A polarizing layer 430 may be formed on the TFE structure 450. The polarizing layer 430 may overlap the light emitting region 30 and the peripheral region 40 on the substrate 110. The polarizing layer 430 may include a linear polarization film and a λ/4 phase retardation film. The λ/4 phase retardation film may be formed using a birefringent film containing polymer, an orientation film of a liquid crystal polymer, alignment layer of a liquid crystal polymer, etc.

The linear polarization film may be formed on the λ/4 phase retardation film. The linear polarization film may selectively transmit an incident light therethrough. For example, the linear polarization film may be formed using iodine-based materials, materials containing dye, polyene-based materials, etc.

After the polarizing layer 430 is formed, the rigid glass substrate 105 may be removed from the substrate 110. Accordingly, the OLED display device 100 illustrated in FIG. 7 may be manufactured.

Figure 19:
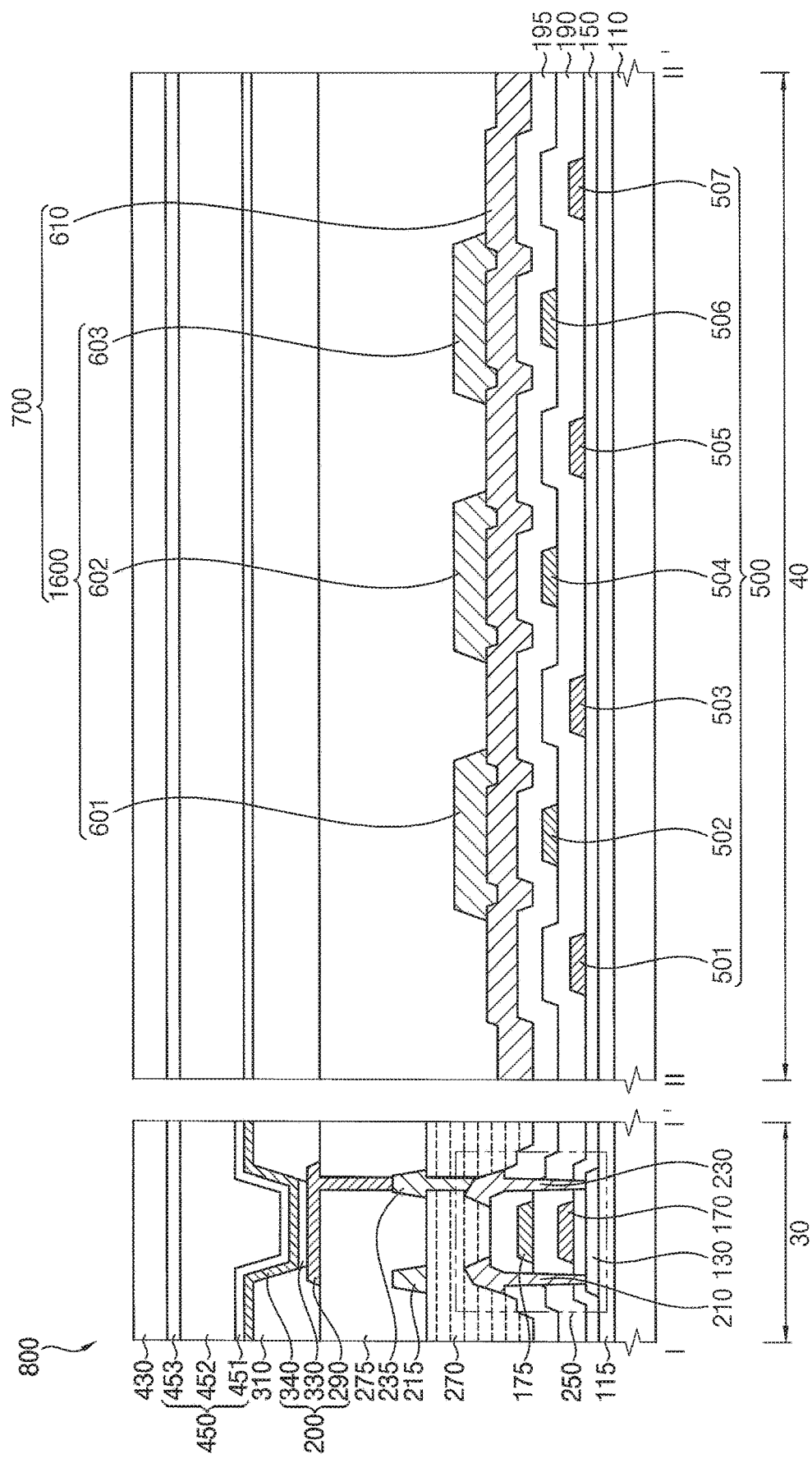
FIG. 19 is a cross-sectional view illustrating an OLED display device in accordance with example embodiments.

FIG. 19 is a cross-sectional view illustrating an OLED display device in accordance with example embodiments. An OLED display device 800 illustrated in FIG. 19 may have a configuration substantially the same as or similar to that of an OLED display device 100 described with reference to FIGS. 1 through 8 except for a conductive patterns 1600. In FIG. 19, detailed descriptions for elements that are substantially the same as or similar to elements described with reference to FIGS. 1 through 8 may not be repeated.

Referring to FIG. 19, an OLED display device 800 may include a substrate 110, a buffer layer 115, a semiconductor element 250, a light emitting structure 200, a fan-out wirings 500, a wiring structure 700, a first planarization layer 270, a second planarization layer 275, a wiring pattern 215, a connection pattern 235, a pixel defining layer 310, a TFE structure 450, a polarizing layer 430, etc. Here, the wiring structure 700 may include conductive patterns 1600 and a conductive layer 610, and the conductive patterns 1600 may include first, second, and third conductive patterns 601, 602, and 603. Here, the first, third, fifth, and seventh fan-out wirings 501, 503, 505, and 507 may be defined as lower fan-out wirings, and the second, fourth, and sixth fan-out wirings 502, 504, and 506 may be defined as upper fan-out wirings.

The conductive patterns 1600 (e.g., the first, second, and third conductive patterns 601, 602, and 603) may be disposed in the peripheral region 40 on the conductive layer 610. In example embodiments, the first, second, and third conductive patterns 601, 602, and 603 may fill a step formed in the conductive layer 610. For example, the steps formed in both lateral portions of the conductive layer 610 that is located on the second fan-out wiring 502 may cover by each of the conductive patterns 1600. In this case, the OLED display device 800 may further prevent a diffused reflection phenomenon.

Figure 20:
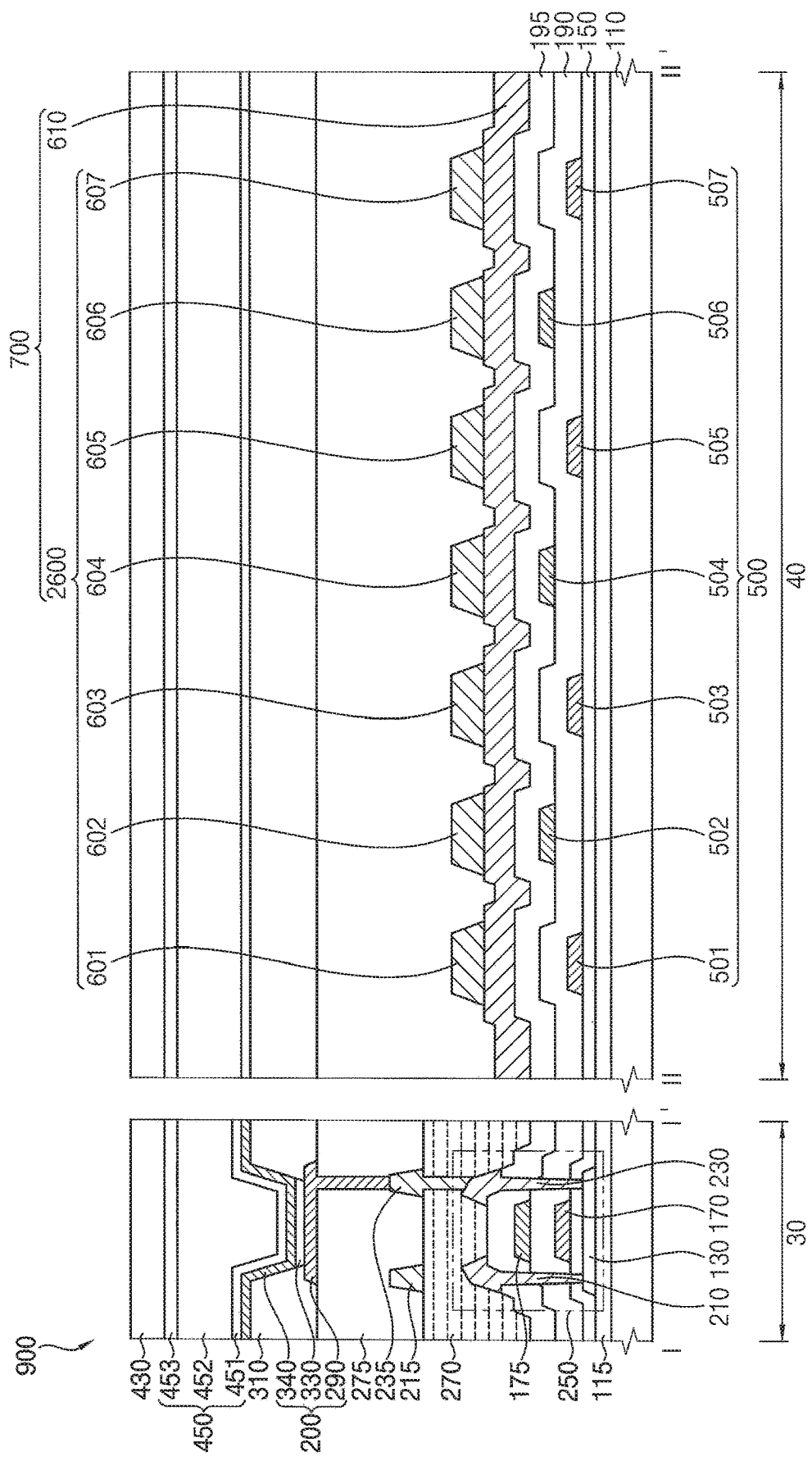
FIG. 20 is a cross-sectional view illustrating an OLED display device in accordance with example embodiments.

FIG. 20 is a cross-sectional view illustrating an OLED display device in accordance with example embodiments. An OLED display device 900 illustrated in FIG. 20 may have a configuration substantially the same as or similar to that of an OLED display device 100 described with reference to FIGS. 1 through 8 except for a conductive patterns 2600. In FIG. 20, detailed descriptions for elements that are substantially the same as or similar to elements described with reference to FIGS. 1 through 8 may not be repeated.

Referring to FIG. 20, an OLED display device 900 may include a substrate 110, a buffer layer 115, a semiconductor element 250, a light emitting structure 200, a fan-out wirings 500, a wiring structure 700, a first planarization layer 270, a second planarization layer 275, a wiring pattern 215, a connection pattern 235, a pixel defining layer 310, a TFE structure 450, a polarizing layer 430, etc. Here, the wiring structure 700 may include conductive patterns 2600 and a conductive layer 610, and the conductive patterns 2600 may include first, second, third, fourth, fifth, sixth, and seventh conductive patterns 601, 602, 603, 604, 605, 606, and 607. Here, the first, third, fifth, and seventh fan-out wirings 501, 503, 505, and 507 may be defined as lower fan-out wirings, and the second, fourth, and sixth fan-out wirings 502, 504, and 506 may be defined as upper fan-out wirings.

The conductive patterns 2600 (e.g., the first, second, third, fourth, fifth, sixth, and seventh conductive patterns 601, 602, 603, 604, 605, 606, and 607) may be disposed in the peripheral region 40 on the conductive layer 610. In example embodiments, the first through seventh conductive patterns 601, 602, 603, 604, 605, 606, and 607 may overlap the fan-out wirings 500, respectively. For example, the first conductive pattern 601 may overlap the first fan-out wiring 501, and the second conductive pattern 602 may overlap the second fan-out wiring 502. The third conductive pattern 603 may overlap the third fan-out wiring 503, and the fourth conductive pattern 604 may overlap the fourth fan-out wiring 504. The fifth conductive pattern 605 may overlap the fifth fan-out wiring 505, and the sixth conductive pattern 606 may overlap the sixth fan-out wiring 506. The seventh conductive pattern 607 may overlap the seventh fan-out wiring 507. In addition, the first through seventh conductive patterns 601, 602, 603, 604, 605, 606, and 607 might not be disposed at a step formed in the conductive layer 610. Alternatively, a width of the first through seventh conductive patterns 601, 602, 603, 604, 605, 606, and 607 each may be less than a width of the fan-out wirings 500 each.

As the OLED display device 900 in accordance with example embodiments includes the relatively large number of the conductive patterns 2600, a wiring resistance of the wiring structure 700 may be relatively reduced.

The present inventive concept may be applied to various display devices including an OLED display device. For example, the present inventive concept may be applied to vehicle-display device, a ship-display device, an aircraft-display device, portable communication devices, display devices for display or for information transfer, a medical-display device, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An organic light emitting diode ("OLED") display device, comprising:
   a substrate having a display region including a light emitting region and a peripheral region surrounding the light emitting region, and a pad region located in one side of the display region;
   a plurality of light emitting structures in the light emitting region on the substrate;
   a plurality of fan-out wirings disposed in the peripheral region on the substrate, the plurality of fan-out wirings including a straight-line portion and an oblique line portion; and
   a wiring structure disposed on the plurality of fan-out wirings, the wiring structure including:
   a conductive layer overlapping the plurality of fan-out wirings and spaces disposed between adjacent fat-out wirings in a plan view; and
   a plurality of conductive patterns spaced apart from each other and disposed on the conductive layer.

2. The OLED display device of claim 1, wherein the conductive patterns are located to overlap the plurality of fan-out wirings.

3. The OLED display device of claim 1, wherein the conductive layer is in direct contact with the conductive pattern.

4. The OLED display device of claim 1, wherein the plurality of fan-out wirings and the wiring structure are disposed at the peripheral region that is located between the light emitting region and the pad region in the peripheral region.

5. The OLED display device of claim 1, wherein each of the straight-line portion of the plurality of fan-out wirings extends in a first direction from the pad region into the display region, and each of the oblique line portion of the plurality of fan-out wirings extends in a direction that is different from the first direction.

6. The OLED display device of claim 5, wherein the straight-line portion and the oblique line portion are integrally formed.

7. The OLED display device of claim 5, wherein the oblique line portion has a first distal end connected to the straight-line portion and a second distal end aligned in one side of the light emitting region.

8. The OLED display device of claim 1, wherein the plurality of fan-out wirings include:
   lower fan-out wirings disposed on the substrate; and
   upper fan-out wirings disposed on the lower fan-out wirings.

9. The OLED display device of claim 8, wherein the lower fan-out wirings and the upper fan-out wirings are alternately disposed not to overlap one another.

10. The OLED display device of claim 8, wherein the conductive pattern overlaps the upper fan-out wiring.

11. The OLED display device of claim 1, wherein the plurality of fan-out wirings include first through (N)th fan-out wirings, where N is an integer greater than 1, and
    wherein (K)th and (K+1)th fan-out wirings among the first through (N)th fan-out wirings are located on different layers, and do not overlap each other, where K is an integer between 1 and N.

12. The OLED display device of claim 11, wherein the conductive patterns include first through (M)th conductive patterns, where M is an integer greater than 1, and
    wherein a (J)th conductive pattern among the first through (M)th conductive patterns is disposed on the (K)th fan-out wirings, and the (J)th conductive pattern does not overlap the (K+1)th fan-out wiring, where J is an integer between 1 and M.

13. The OLED display device of claim 1, further comprising:
    an insulating interlayer disposed along a profile of the fan-out wiring in the peripheral region on the substrate,
    wherein the conductive layer is disposed along a profile of the insulating interlayer on the insulating interlayer.

14. The OLED display device of claim 13, wherein the conductive pattern is disposed on a portion under which the fan-out wiring is disposed.

15. The OLED display device of claim 1, wherein the substrate further includes a bending region located between the display region and the pad region.

16. The OLED display device of claim 15, further comprising:
    a plurality of pad electrodes disposed in the pad region, the pad electrodes being connected to an external device; and
    connection electrodes disposed in the bending region, the connection electrodes electrically connecting the plurality of fan-out wirings and the pad electrodes.

17. The OLED display device of claim 1, further comprising:
    a plurality of semiconductor elements disposed between the substrate and the light emitting structures;
    a planarization layer disposed on the semiconductor elements; and
    a wiring pattern and a connection pattern disposed on the planarization layer.

18. The OLED display device of claim 17, wherein each of the semiconductor elements includes:
    an active layer disposed on the substrate;
    a gate electrode disposed on the active layer; and
    source and drain electrodes disposed on the gate electrode,
    wherein the gate electrode and the fan-out wiring are located on a same layer, and the source and drain electrodes and the conductive layer are located on a same layer, and
    wherein the wiring and connection patterns and the conductive pattern are located on a same layer.

19. The OLED display device of claim 18, wherein the planarization layer is interposed between the wiring and connection patterns and the semiconductor element in the light emitting region, and is not interposed between the conductive patterns and the conductive layer in the peripheral region.

20. The OLED display device of claim 1, further comprising:
- a thin film encapsulation structure disposed on the light emitting structures,
- wherein each of the light emitting structures includes:
  - a lower electrode;
  - a light emitting layer disposed on the lower electrode; and
  - an upper electrode disposed on the light emitting layer, and
- wherein the thin film encapsulation structure includes:
  - a first thin film encapsulation layer disposed on the upper electrode, the first thin film encapsulation layer including inorganic materials having flexibility;
  - a second thin film encapsulation layer disposed on the first thin film encapsulation layer, the second thin film encapsulation layer including organic materials having the flexibility; and
  - a third thin film encapsulation layer disposed on the second thin film encapsulation layer, the third thin film encapsulation layer including the inorganic materials having the flexibility.

* * * * *